(12) United States Patent
Lee et al.

(10) Patent No.: US 11,882,691 B2
(45) Date of Patent: *Jan. 23, 2024

(54) METHODS OF FABRICATING SEMICONDUCTOR DEVICE

(71) Applicant: Samsung Electronics Co., Ltd., Suwon-si (KR)

(72) Inventors: Seung-Heon Lee, Seoul (KR); Munjun Kim, Suwon-si (KR); ByeongJu Bae, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,361

(22) Filed: Jul. 6, 2022

(65) Prior Publication Data
US 2022/0336468 A1   Oct. 20, 2022

Related U.S. Application Data

(63) Continuation of application No. 16/939,446, filed on Jul. 27, 2020, now Pat. No. 11,393,827, which is a (Continued)

(30) Foreign Application Priority Data

Jul. 1, 2015   (KR) .................. 10-2015-0094140

(51) Int. Cl.
*H01L 21/3213* (2006.01)
*H01L 21/033* (2006.01)
(Continued)

(52) U.S. Cl.
CPC ....... *H10B 12/482* (2023.02); *H01L 21/0332* (2013.01); *H01L 21/32139* (2013.01);
(Continued)

(58) Field of Classification Search
None
See application file for complete search history.

(56) References Cited

U.S. PATENT DOCUMENTS 6,617,253 B1   9/2003  Chu et al.
7,052,970 B2   5/2006  Radecker
(Continued)

FOREIGN PATENT DOCUMENTS

KR   2004-0031955 A   4/2004
KR   10-2007-0052653 A   5/2007
(Continued)

OTHER PUBLICATIONS

U.S. Office Action dated Jul. 8, 2019 in U.S. Appl. No. 15/160,264.

*Primary Examiner* — Xiaoming Liu
(74) *Attorney, Agent, or Firm* — Harness, Dickey & Pierce, P.L.C.

(57) ABSTRACT

A method of fabricating a semiconductor device includes forming a device isolation layer in a substrate to define active regions, forming a conductive layer on the active regions, forming first mask patterns intersecting the active regions on the conductive layer, etching the conductive layer using the first mask patterns as etch masks to form bit lines, growing second mask patterns from top surfaces of the first mask patterns, and performing a patterning process using the second mask patterns as etch masks to form contact holes exposing the active regions between the bit lines.

20 Claims, 56 Drawing Sheets

Related U.S. Application Data continuation of application No. 16/426,075, filed on May 30, 2019, now Pat. No. 10,748,908, which is a continuation of application No. 15/160,264, filed on May 20, 2016, now Pat. No. 10,566,333.

(51) Int. Cl.
*H10B 12/00* (2023.01)
*H01L 21/8234* (2006.01)

(52) U.S. Cl.
CPC ............ *H01L 21/823475* (2013.01); *H01L 21/823481* (2013.01); *H10B 12/0335* (2023.02); *H10B 12/315* (2023.02); *H10B 12/485* (2023.02)

(56) References Cited

U.S. PATENT DOCUMENTS

| | | | |
|---|---|---|---|
| 7,427,564 B2 | 9/2008 | Hwang et al. | |
| 7,678,689 B2 | 3/2010 | Kim | |
| 8,546,196 B2 | 10/2013 | Kuniya et al. | |
| 8,779,422 B2 | 7/2014 | Lee et al. | |
| 10,748,908 B2* | 8/2020 | Lee | H01L 21/32139 |
| 11,393,827 B2* | 7/2022 | Lee | H10B 12/482 |
| 2009/0026526 A1 | 1/2009 | Cho et al. | |
| 2009/0045391 A1 | 2/2009 | Won | |
| 2010/0019302 A1 | 1/2010 | Lee et al. | |
| 2010/0173469 A1 | 7/2010 | Lee et al. | |
| 2011/0186923 A1 | 8/2011 | Seo et al. | |
| 2012/0056245 A1 | 3/2012 | Kang et al. | |
| 2012/0276743 A1 | 11/2012 | Won et al. | |
| 2014/0045124 A1 | 2/2014 | Park | |
| 2014/0051256 A1 | 2/2014 | Zhong et al. | |
| 2014/0110816 A1 | 4/2014 | Kim et al. | |
| 2014/0231892 A1* | 8/2014 | Song | H01L 21/7682 257/296 |
| 2014/0332932 A1 | 11/2014 | Zhang et al. | |
| 2015/0034592 A1 | 2/2015 | Huff et al. | |

FOREIGN PATENT DOCUMENTS

| | | |
|---|---|---|
| KR | 2008-0039144 A | 5/2008 |
| KR | 10-2012-0121340 A | 11/2012 |

* cited by examiner

METHODS OF FABRICATING SEMICONDUCTOR DEVICE

CROSS-REFERENCE TO RELATED APPLICATION

This is a continuation of U.S. application Ser. No. 16/939,446, filed Jul. 27, 2020, which is a continuation of U.S. application Ser. No. 16/426,075, filed on May 30, 2019, which is a continuation of U.S. application Ser. No. 15/160,264, filed on May 20, 2016, which claims priority under 35 U.S.C. § 119 to Korean Patent Application No. 10-2015-0094140, filed on Jul. 1, 2015, in the Korean Intellectual Property Office, the disclosures of each of which are hereby incorporated by reference in their entirety.

BACKGROUND

Example embodiments of the inventive concepts relate to methods of fabricating a semiconductor device and/or to methods of fabricating a semiconductor device capable of reducing or substantially preventing process defects.

Semiconductor devices are widely used in an electronic industry because of their small sizes, multi-functional characteristics, and low fabrication costs. However, semiconductor devices have been highly integrated with the development of the electronic industry. Widths and spaces of patterns of semiconductor devices have been reduced to highly integrate semiconductor devices. However, new exposure techniques and/or high-priced exposure techniques are demanded to form fine patterns, so it is typically challenging to highly integrate semiconductor devices. Thus, various researches are being conducted for new integration techniques.

SUMMARY

Example embodiments of the inventive concepts may provide methods of fabricating a semiconductor device capable of reducing or substantially preventing the occurrence of a defect during a process.

Example embodiments of the inventive concepts may also provide methods of fabricating a semiconductor device capable of simplifying processes.

In one example embodiment, a method of fabricating a semiconductor device may include forming a device isolation layer in a substrate to define active regions, forming a conductive layer on the active regions, forming first mask patterns intersecting the active regions on the conductive layer, etching the conductive layer using the first mask patterns as etch masks to form bit lines, growing second mask patterns from top surfaces of the first mask patterns, and performing a patterning process using the second mask patterns as etch masks to form contact holes exposing the active regions between the bit lines.

In an example embodiment, the method may further include filling the contact holes with a conductive material, and performing an etch-back process on the conductive material to form storage node contacts. At least a portion of the second mask patterns may be removed during the etch-back process.

In an example embodiment, the method may further include forming capacitors on the storage node contacts.

In an example embodiment, the method may further include forming landing pads between the storage node contacts and the capacitors.

In an example embodiment, a thickness of each of, or of one or more of, the second mask patterns may range from about 25% to about 50% of a thickness of each of, or of one or more of, the first mask patterns.

In an example embodiment, the second mask patterns may be locally formed on the top surfaces of the first mask patterns, respectively.

In an example embodiment, the first mask patterns may have line shapes, and the second mask patterns may have line shapes aligned with the first mask patterns, respectively. The second mask patterns may be in contact with the top surfaces of the first mask patterns, respectively.

In an example embodiment, the second mask patterns may be formed without a photolithography process.

In an example embodiment, growing the second mask patterns may include alternately and repeatedly supplying a source gas and an etching gas into the same process chamber.

In an example embodiment, the etching gas may not be supplied when the source gas is supplied.

In an example embodiment, the process chamber may include a susceptor on which the substrate is loaded, and a radio-frequency (RF) bias connected to the susceptor. Power of the RF bias when the etching gas is supplied may be greater than that of the RF bias when the source gas is supplied.

In an example embodiment, the RF bias may be off when the source gas is supplied, and the RF bias may be on when the etching gas is supplied.

In an example embodiment, growing the second mask patterns may further include performing a purge process between supplying the source gas and supplying the etching gas.

In an example embodiment, growing the second mask patterns may be performed by an inductively coupled plasma (ICP) method.

In an example embodiment, a width of an upper portion of each of, or of one or more of, the second mask patterns may be smaller than the width of a lower portion of each of, or of one or more of, the second mask patterns.

In an example embodiment, the upper portion of each of, or of one or more of, the second mask patterns may have a tapered portion protruding in a direction away from the substrate.

In an example embodiment, the second mask patterns may be formed of or include substantially the same material as the first mask patterns.

In an example embodiment, forming the conductive layer may include forming a semiconductor layer on the active regions, forming contact patterns that penetrate the semiconductor layer so as to be connected to the active regions, and forming a metal layer on the contact patterns.

In an example embodiment, the contact patterns may be patterned by etching the conductive layer using the first mask patterns, thereby forming bit line node contacts.

In an example embodiment, the method may further include forming insulating patterns between the bit lines. The contact holes may be regions defined by the bit lines and the insulating patterns.

In another example embodiment, a method of fabricating a semiconductor device may include forming a device isolation layer in a substrate to define active regions, forming a conductive layer on the active regions, forming first mask patterns intersecting the active regions on the conductive layer, etching the conductive layer using the first mask patterns as etch masks to form bit lines, growing second mask patterns on the first mask patterns, forming insulating patterns between the bit lines, the insulating patterns arranged to constitute a plurality of rows that are parallel to a direction intersecting the second mask patterns, forming contact holes defined by the second mask patterns and the insulating patterns, forming a conductive material in the contact holes, and performing an etch-back process on the conductive material. At least a portion of the second mask patterns may be removed during the etch-back process.

In an example embodiment, the second mask patterns may be substantially completely removed by the etch-back process and the first mask patterns may be partially removed by the etch-back process. Upper portions of the first mask patterns may have tapered portions protruding in a direction that is away from the substrate after the etch-back process.

In an example embodiment, the second mask patterns may be locally formed on top surfaces of the first mask patterns, respectively.

In an example embodiment, the first mask patterns may have line shapes, and the second mask patterns may have line shapes aligned with the first mask patterns, respectively. The second mask patterns may be in contact with the top surfaces of the first mask patterns, respectively.

In an example embodiment, growing the second mask patterns may include alternately and repeatedly supplying a source gas and an etching gas into the same process chamber.

In an example embodiment, the process chamber may include a susceptor on which the substrate is loaded, and a radio-frequency (RF) bias connected to the susceptor. Power of the RF bias when the etching gas is supplied may be greater than the power of the RF bias when the source gas is supplied.

In an example embodiment, the RF bias may be off when the source gas is supplied, and the RF bias may be on when the etching gas is supplied.

In an example embodiment, an upper portion of each of, or of one or more of, the second mask patterns may have a tapered portion protruding in a direction away from the substrate.

In still another example embodiment, a method of fabricating a semiconductor device may include forming, for example sequentially forming, a first etch target layer and a second etch target layer on a substrate, forming first mask patterns on the second etch target layer, patterning the second etch target layer using the first mask patterns as etch masks, and growing second mask patterns on the first mask patterns after patterning the second etch target layer. Growing the second mask patterns may include loading the substrate into a process chamber, and alternately and repeatedly supplying a source gas and an etching gas into the process chamber. The process chamber may include a susceptor on which the substrate is disposed, and a radio-frequency (RF) bias connected to the susceptor. The RF bias may be off when the source gas is supplied, and the RF bias may be on when the etching gas is supplied.

In an example embodiment, the etching gas may not be supplied when the source gas is supplied.

In an example embodiment, the method may further include performing a purge process between supplying the source gas and supplying the etching gas.

In an example embodiment, the second mask patterns may be grown in an inductively coupled plasma (ICP) apparatus.

In an example embodiment, a width of an upper portion of each of, or of one or more of, the second mask patterns may be smaller than the width of a lower portion of each of, or of one or more of, the second mask patterns.

In an example embodiment, an upper portion of each of, or of one or more of, the second mask patterns may have a tapered portion protruding in a direction away from the substrate.

In an example embodiment, the second mask patterns may be formed of or include substantially the same material as the first mask patterns.

Example embodiments relate to a method of fabricating a semiconductor device, the method including forming a device isolation layer in a substrate, forming a conductive layer on at least one portion of the device isolation layer, forming at least one first mask pattern on the conductive layer, and forming at least one second mask pattern on the at least one first mask pattern, wherein an aspect ratio of a combination of the at least one first mask pattern and the at least one second mask pattern is less than 15.

BRIEF DESCRIPTION OF THE DRAWINGS

The inventive concepts will become more apparent in view of the attached drawings and accompanying detailed description.

FIGS. 1A to 13A are plan views illustrating a method of fabricating a semiconductor device, according to an example embodiment of the inventive concepts.

FIGS. 1B to 13B are cross-sectional views taken along lines I-I' of FIGS. 1A to 13A, respectively, to illustrate a method of fabricating a semiconductor device, according to an example embodiment of the inventive concepts.

FIGS. 1C to 13C are cross-sectional views taken along lines II-II' of FIGS. 1A to 13A, respectively, to illustrate a method of fabricating a semiconductor device, according to an example embodiment of the inventive concepts.

FIGS. 1D to 13D are cross-sectional views taken along lines III-III' of FIGS. 1A to 13A, respectively, to illustrate a method of fabricating a semiconductor device, according to an example embodiment of the inventive concepts.

DETAILED DESCRIPTION OF THE EMBODIMENTS

Figure 1A:
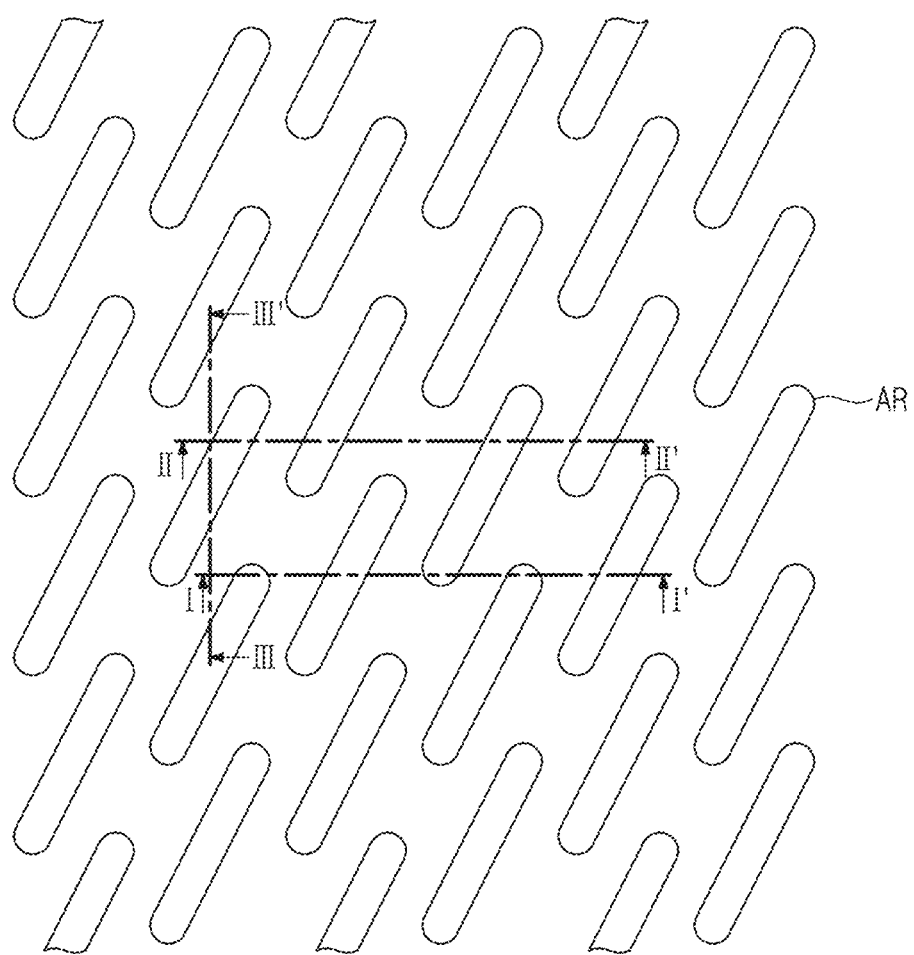
Figure 1B:
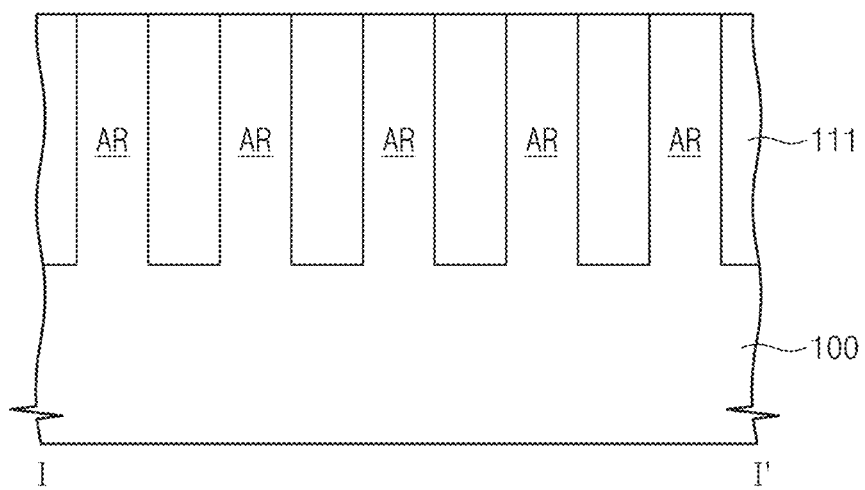
Figure 1C:
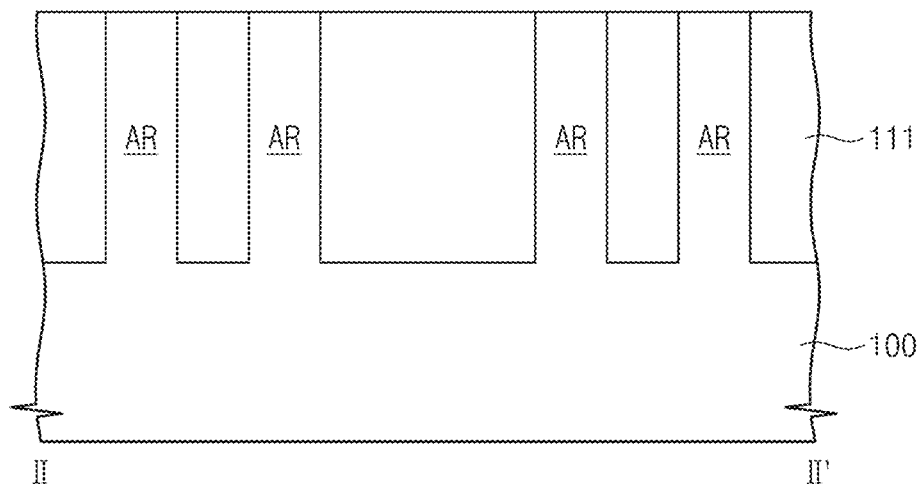
Figure 1D:
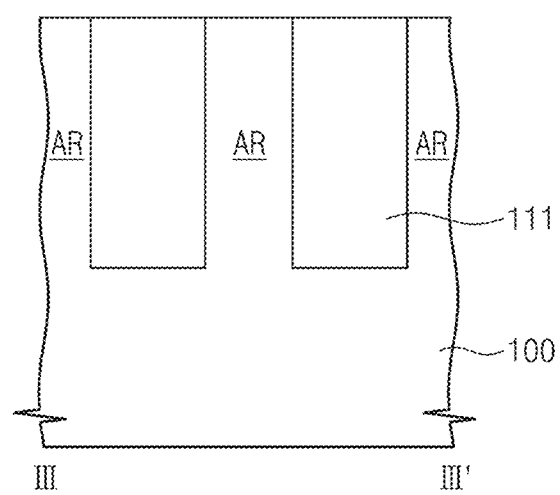
Figure 2A:
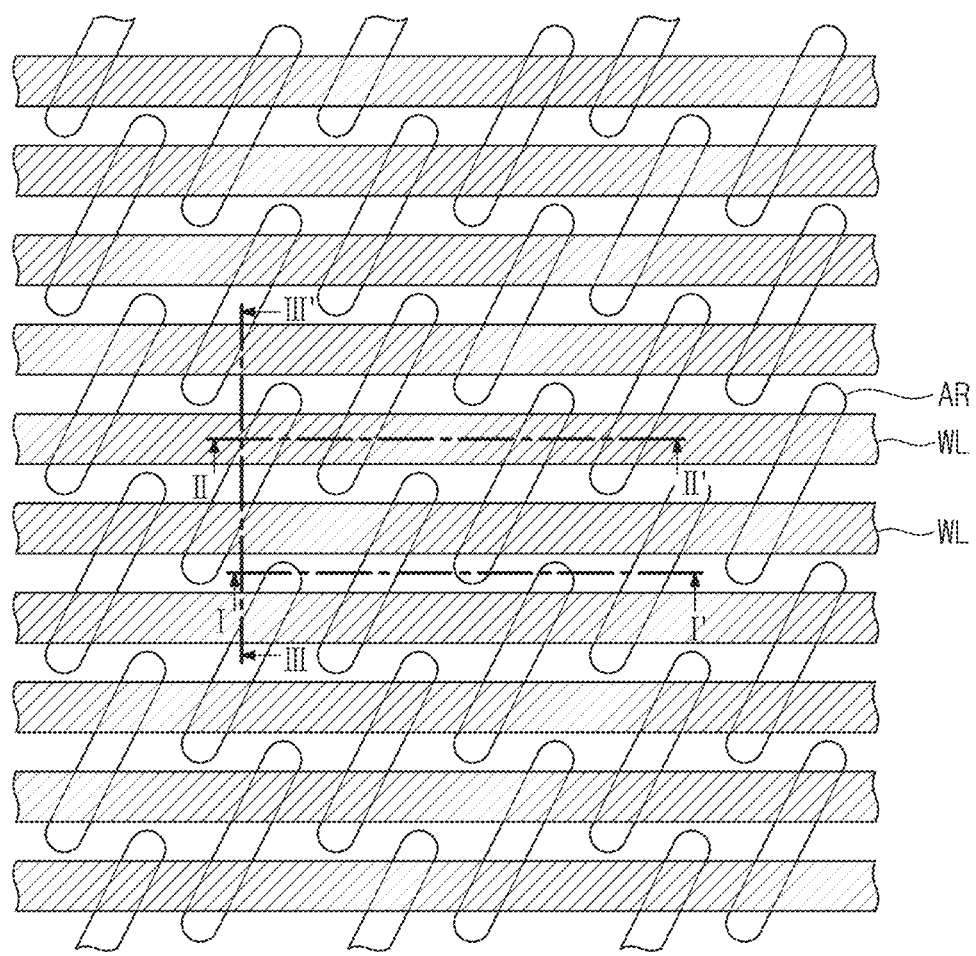
Figure 2B:
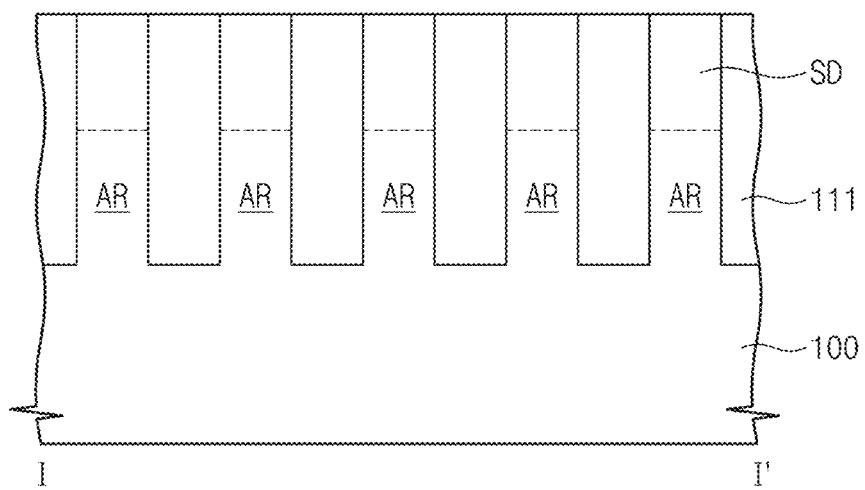
Figure 2C:
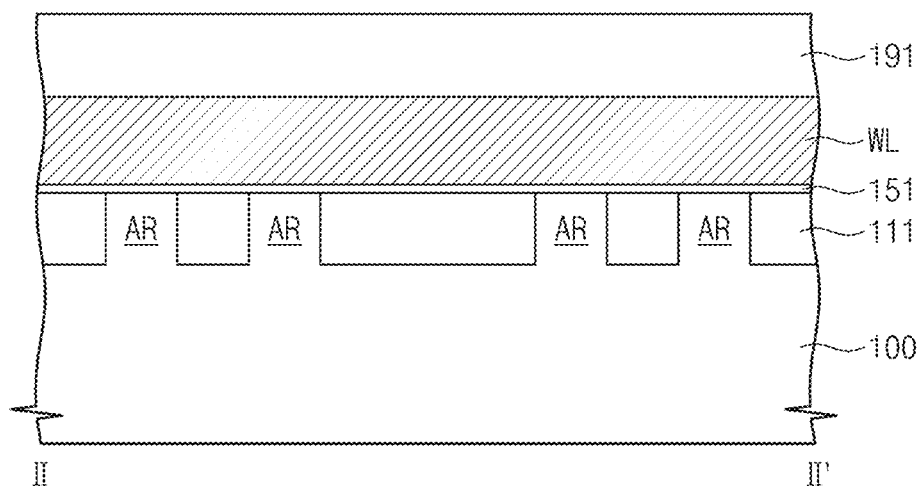
Figure 2D:
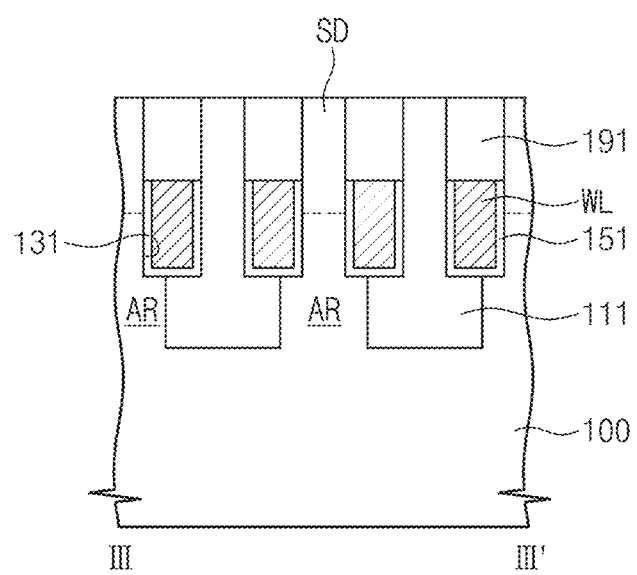
Figure 3A:
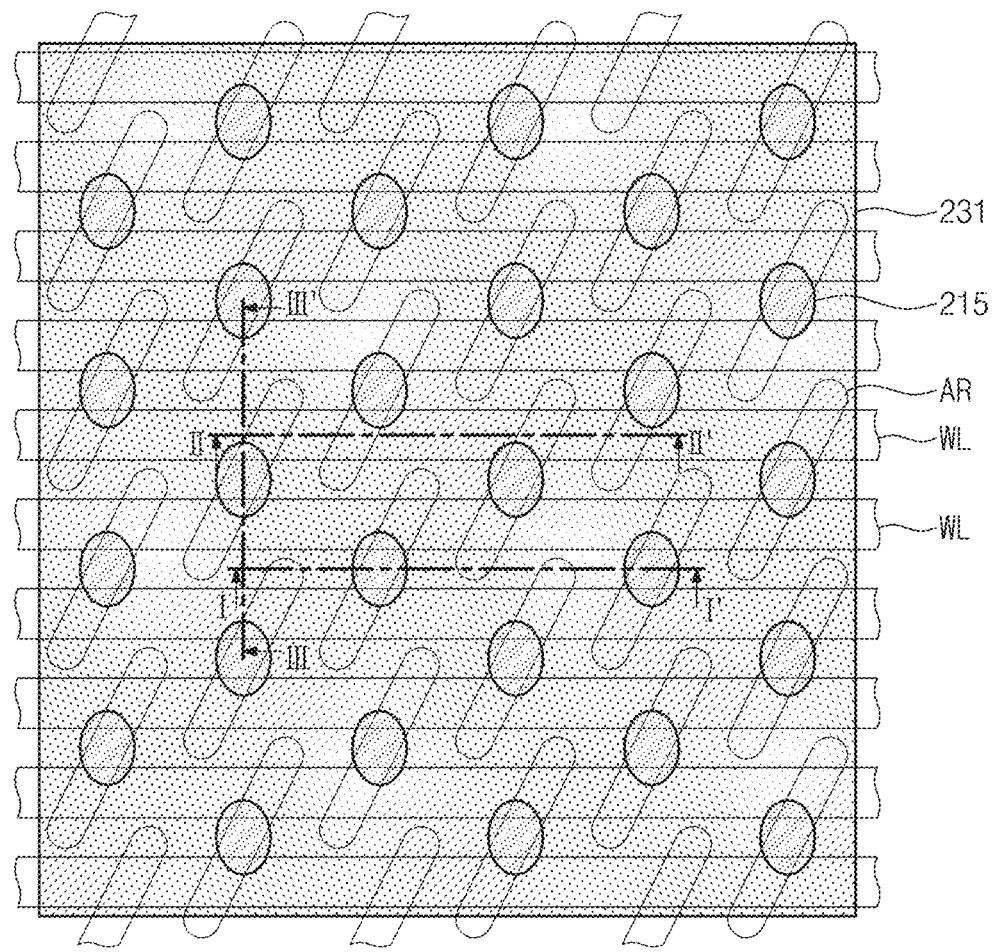
Figure 3B:
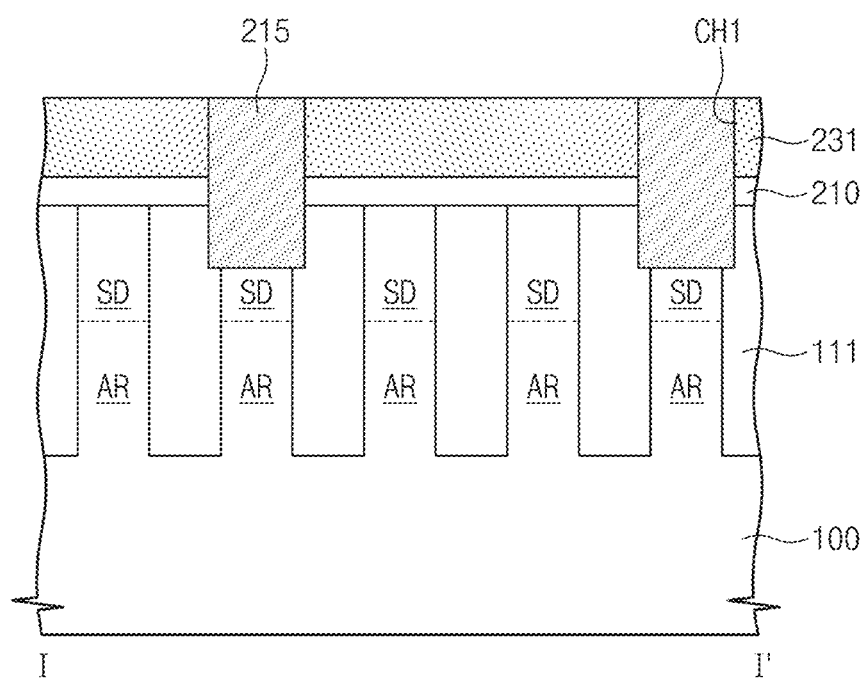
Figure 3C:
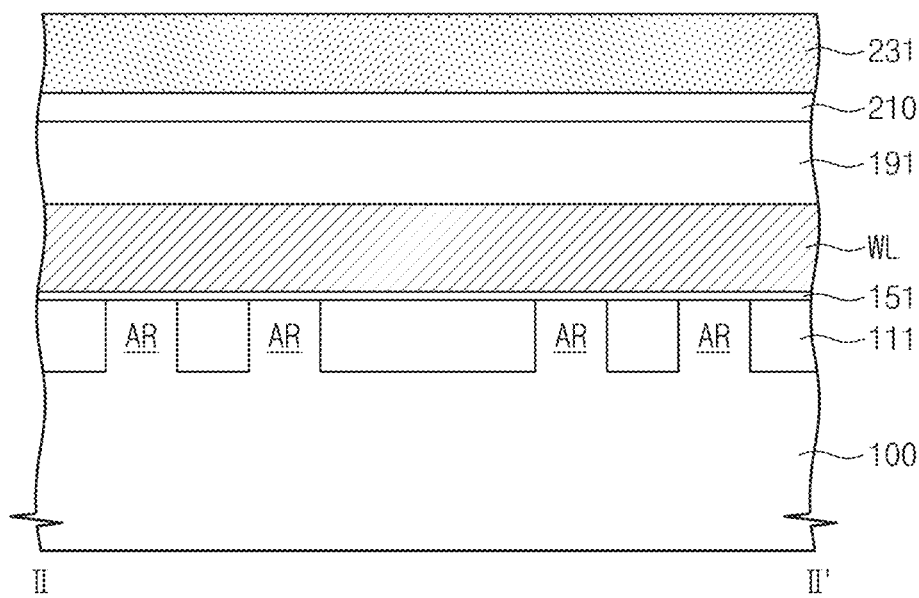
Figure 3D:
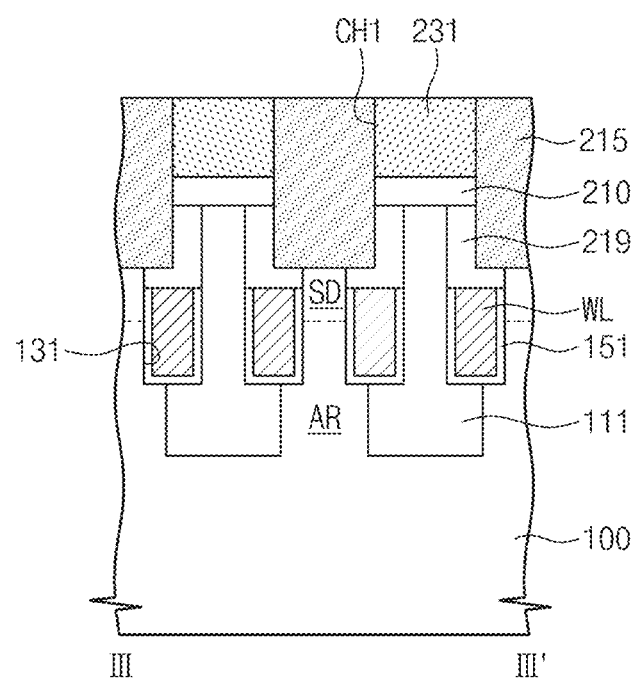
Figure 4A:
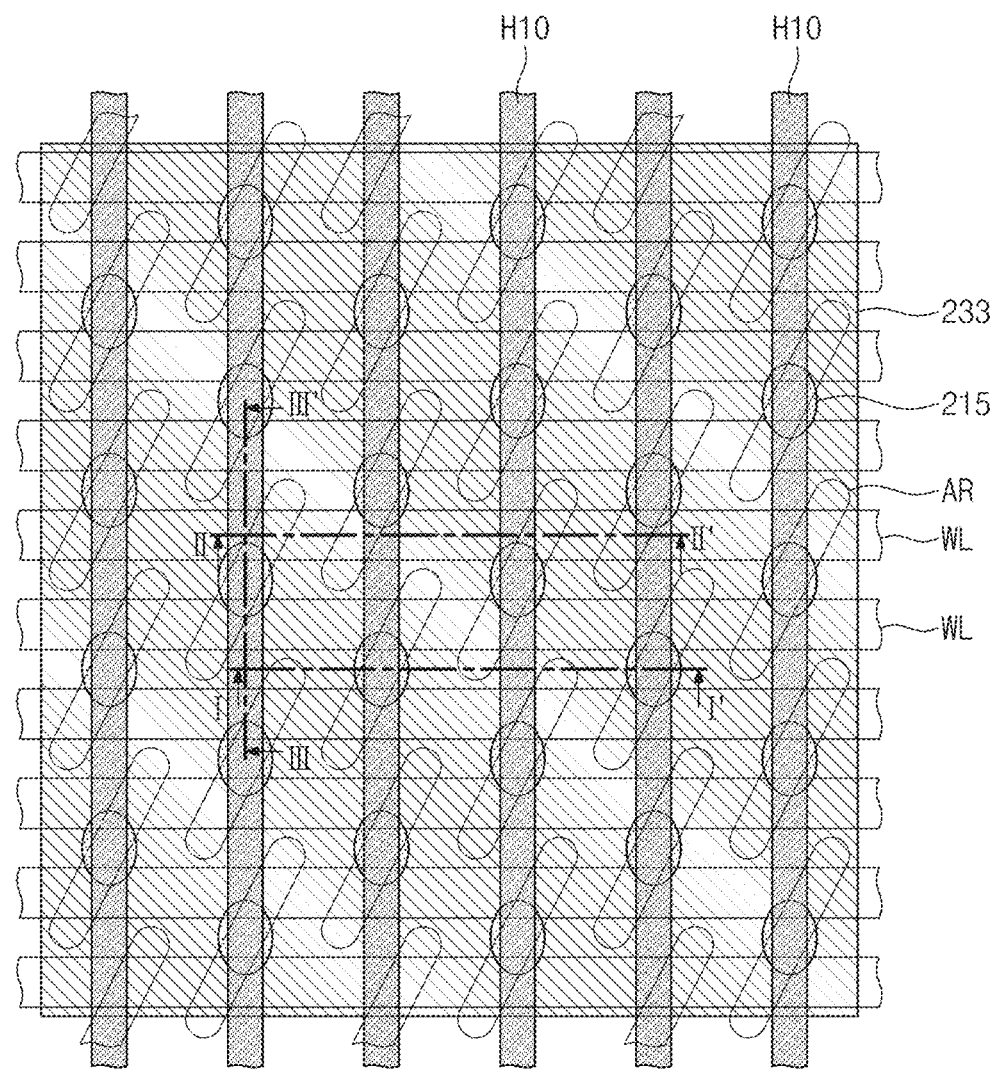
Figure 4B:
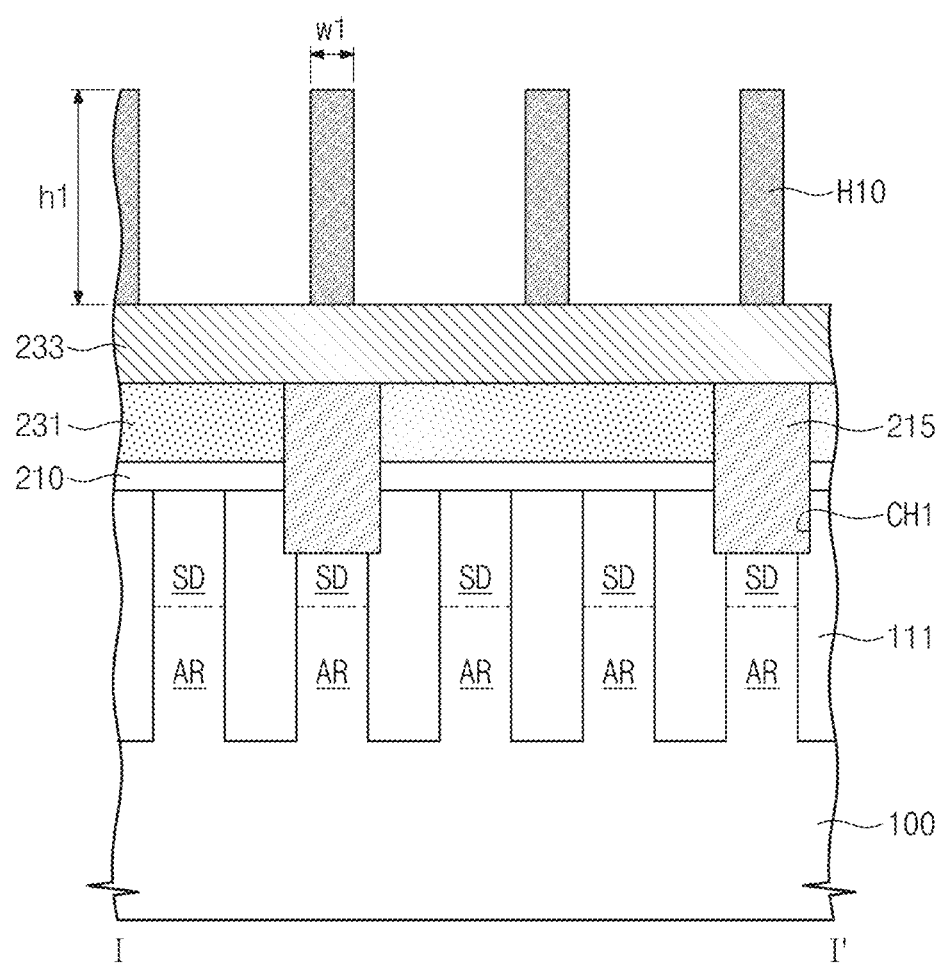
Figure 4C:
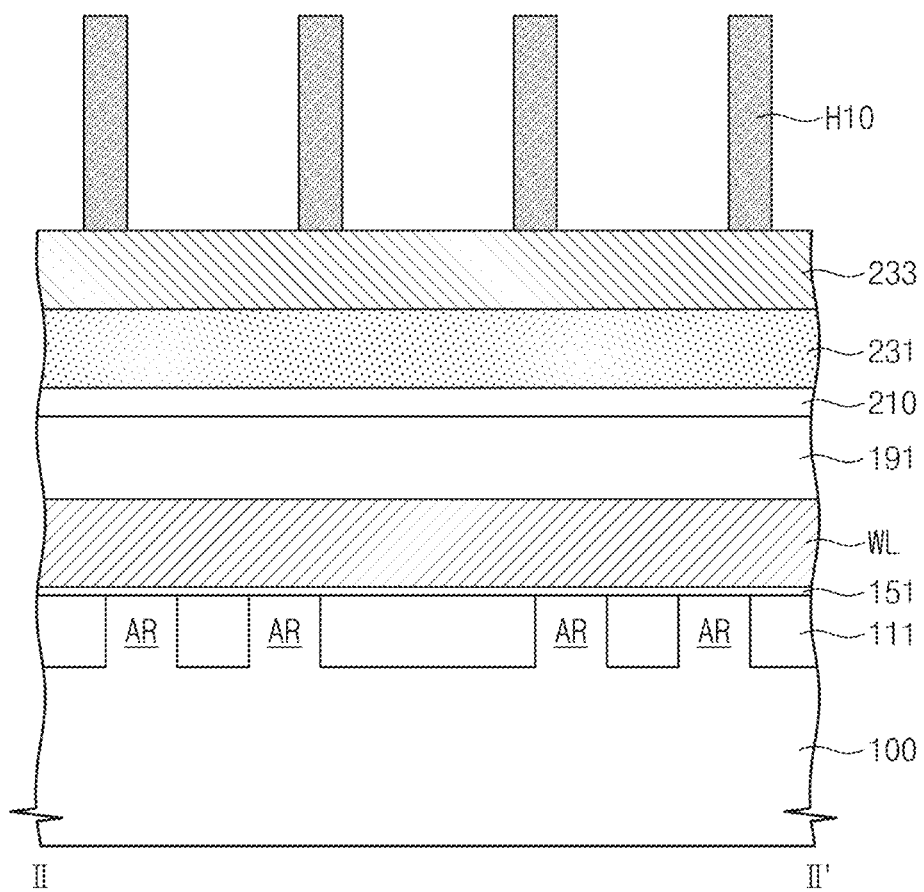
Figure 4D:
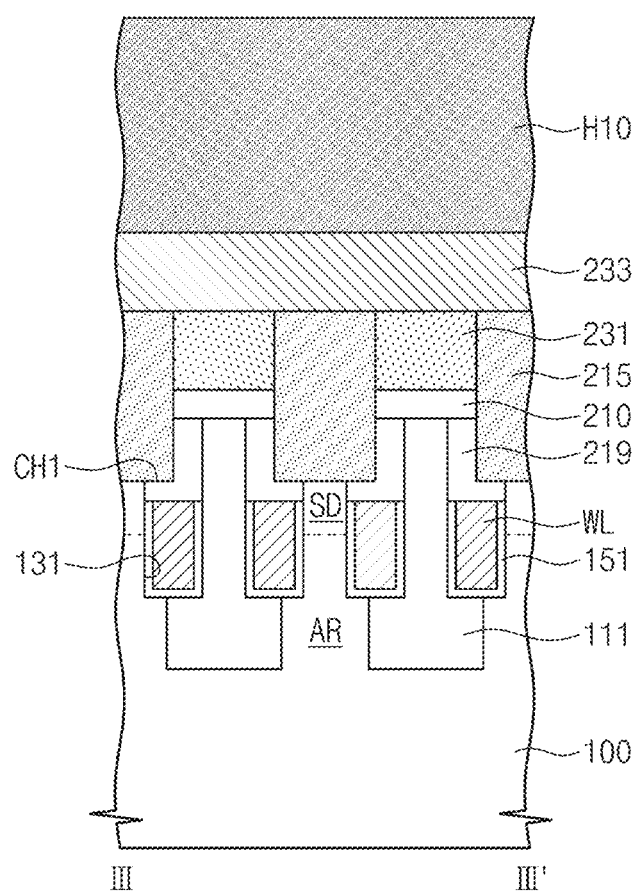
Figure 5A:
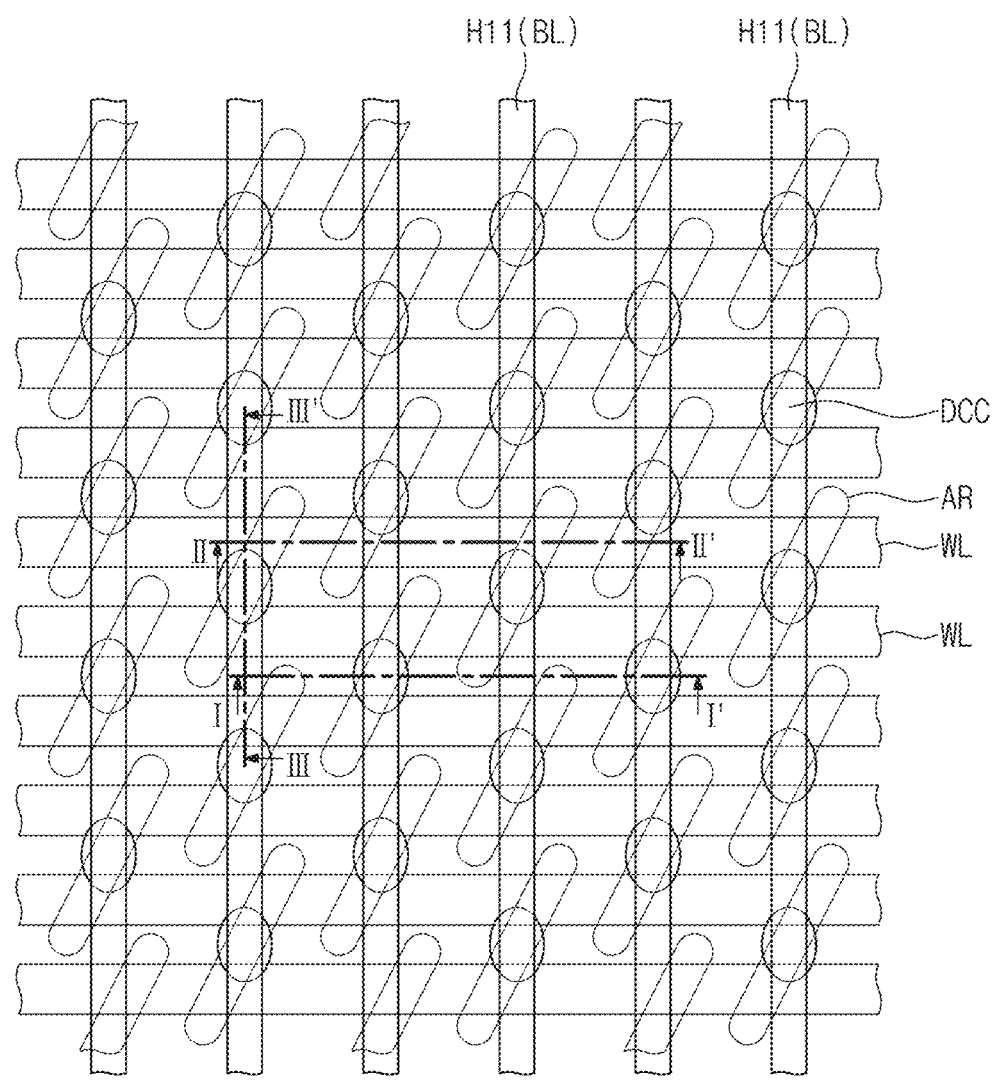
Figure 5B:
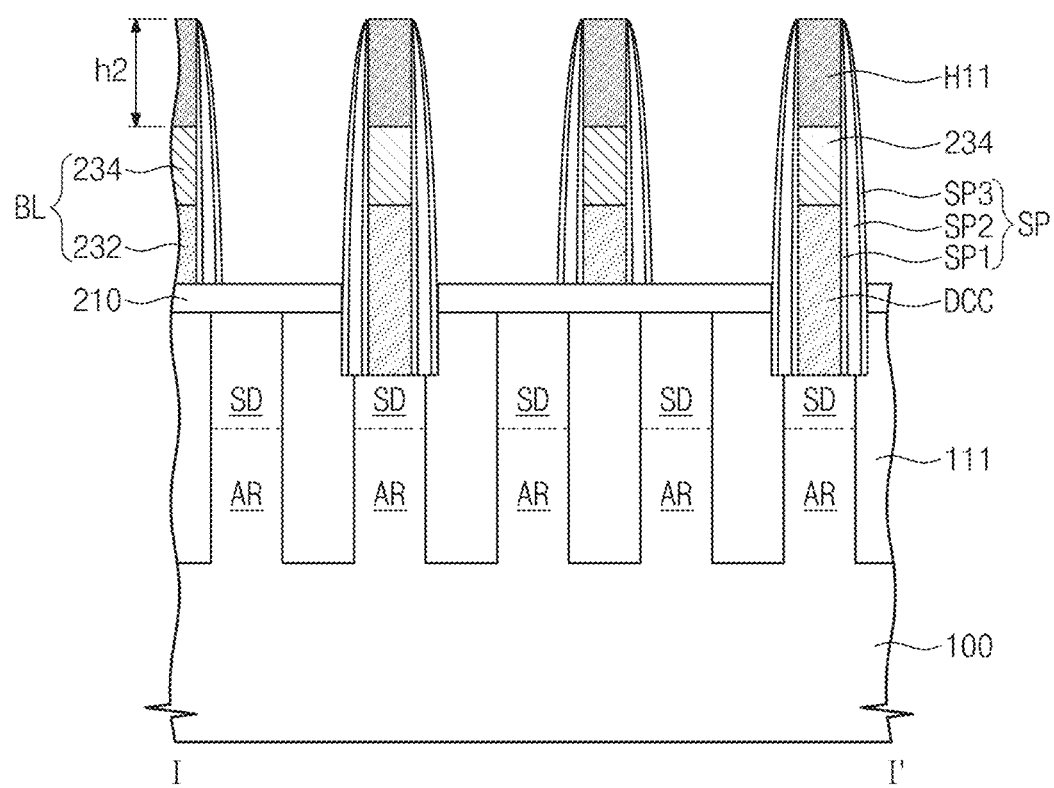
Figure 5C:
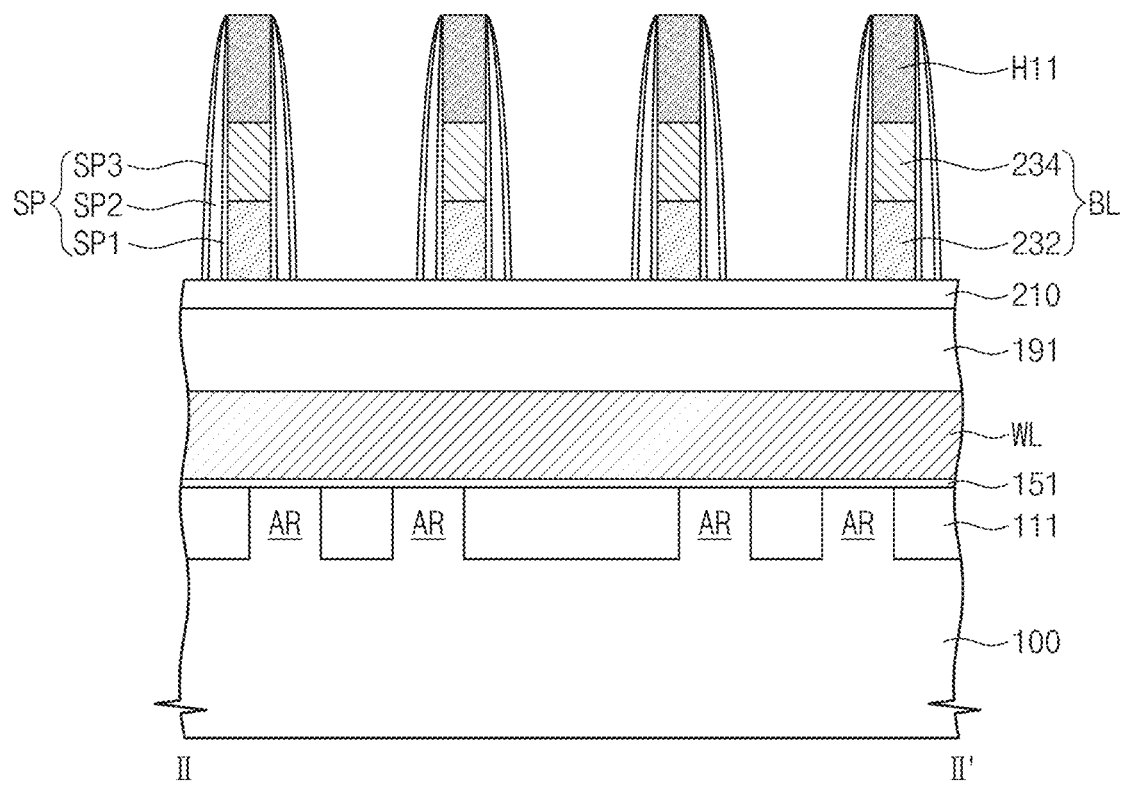
Figure 5D:
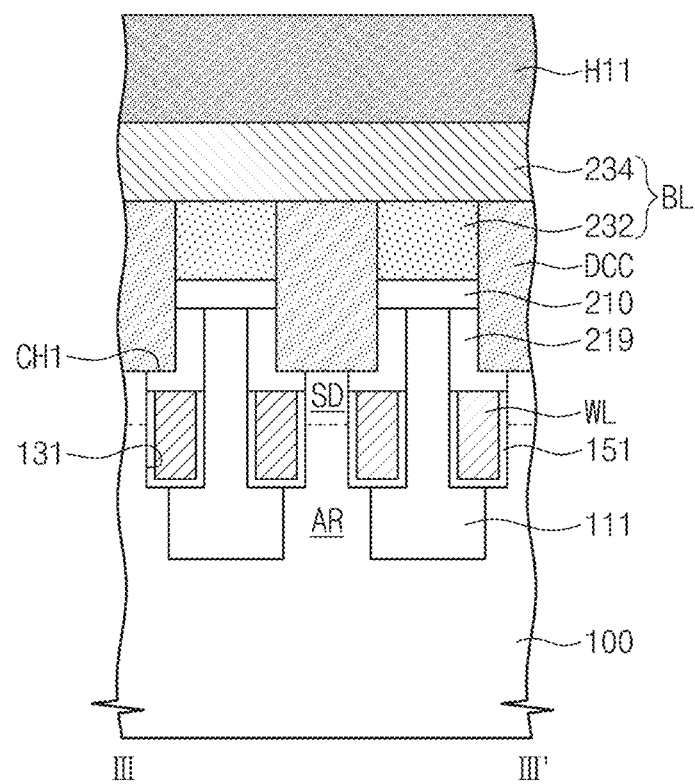
Figure 6A:
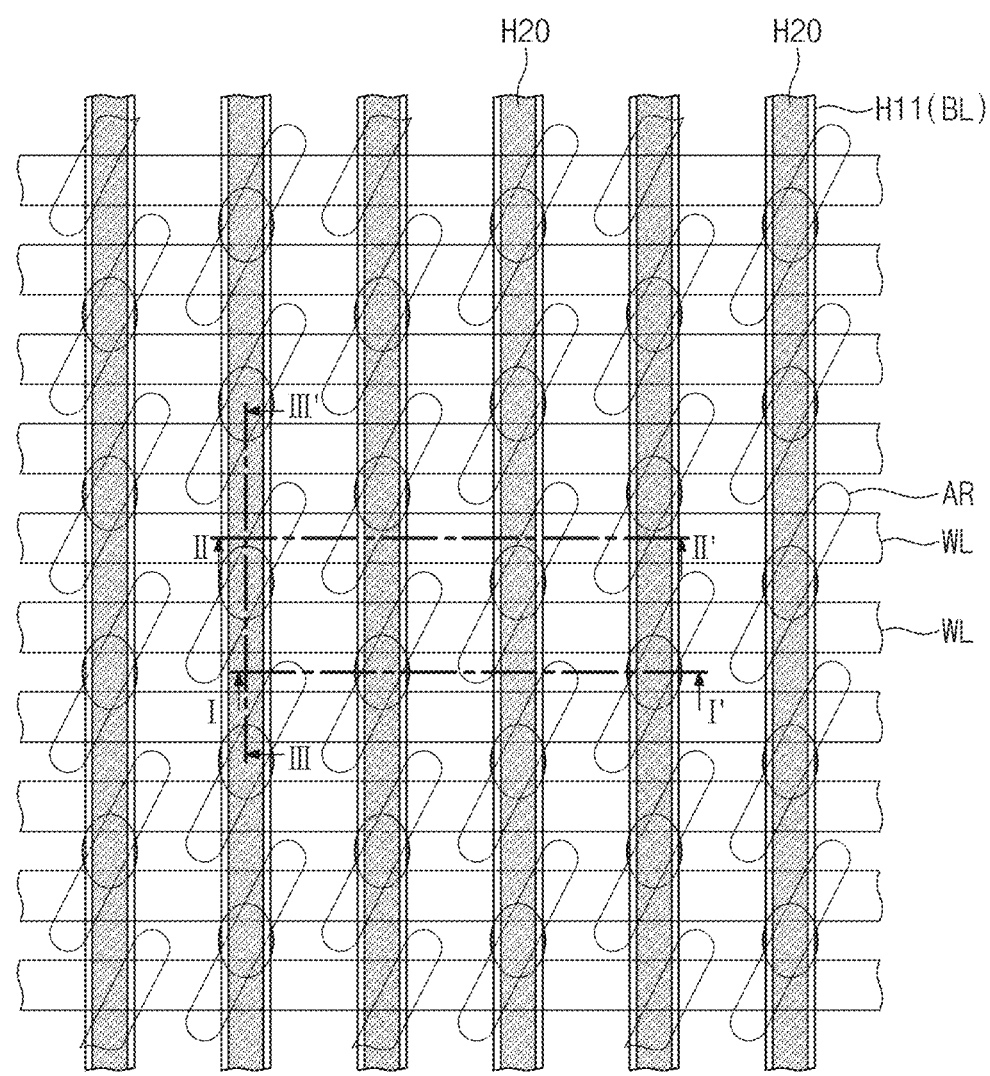
Figure 6B:
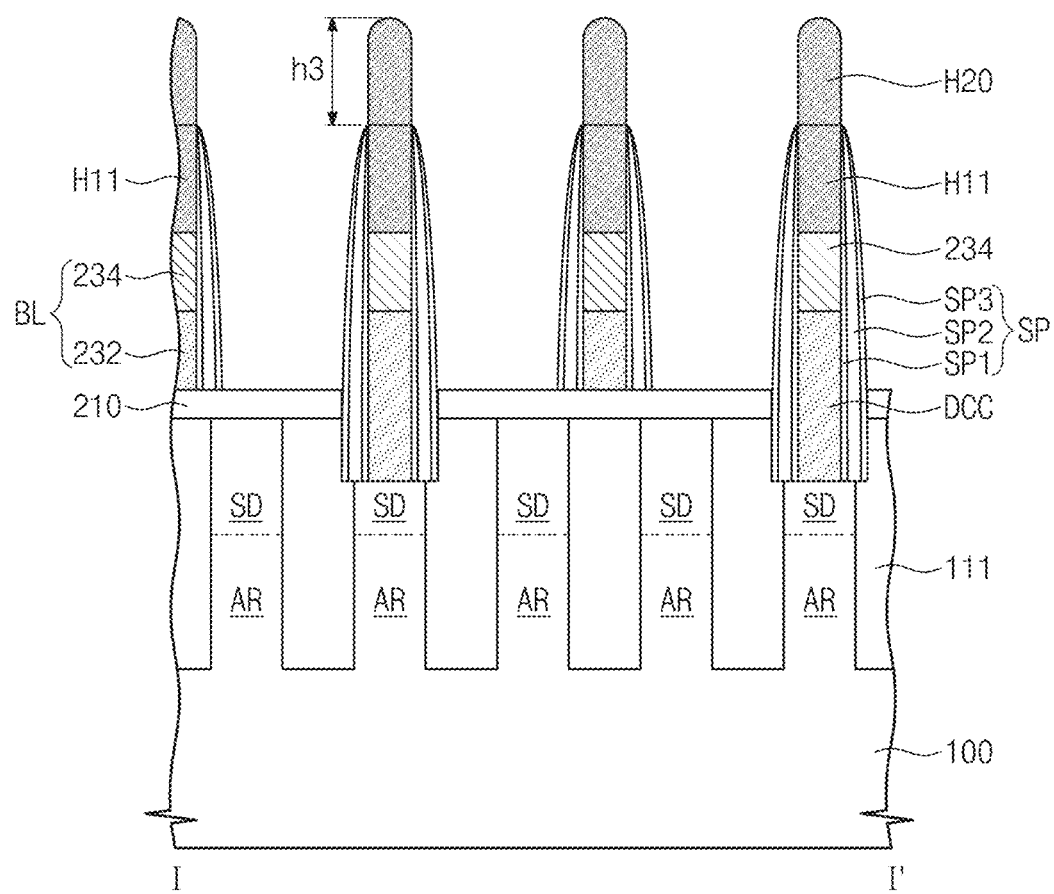
Figure 6C:
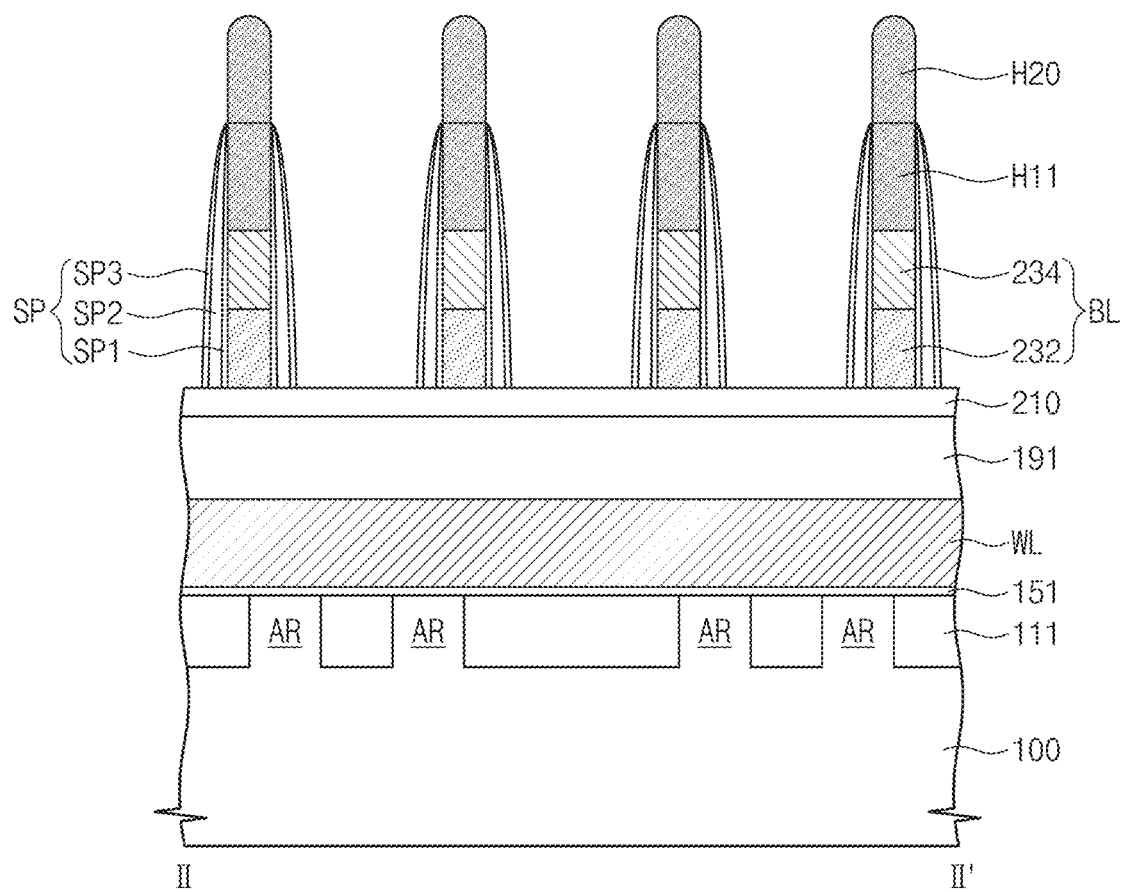
Figure 6D:
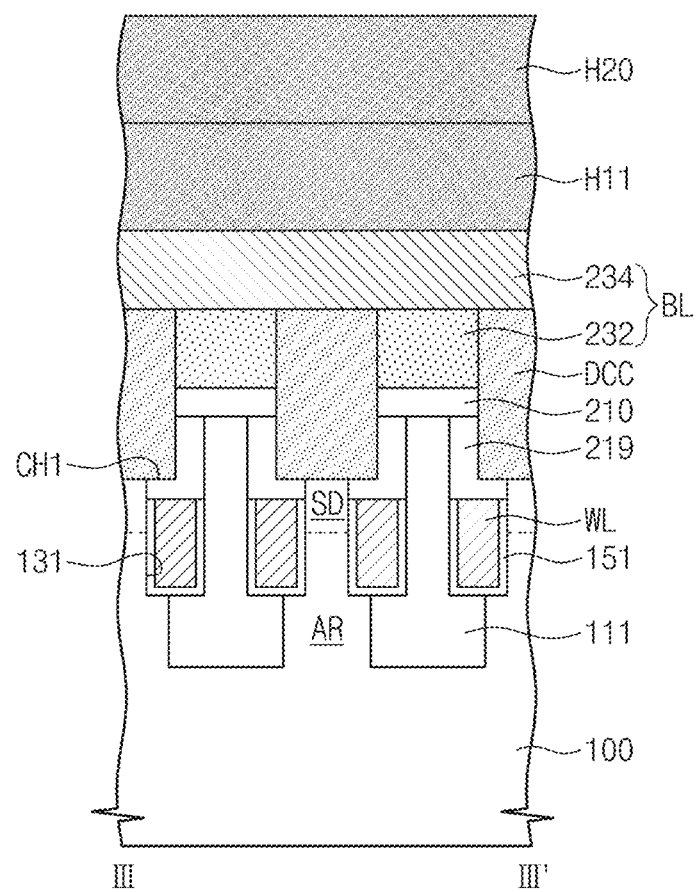
Figure 7A:
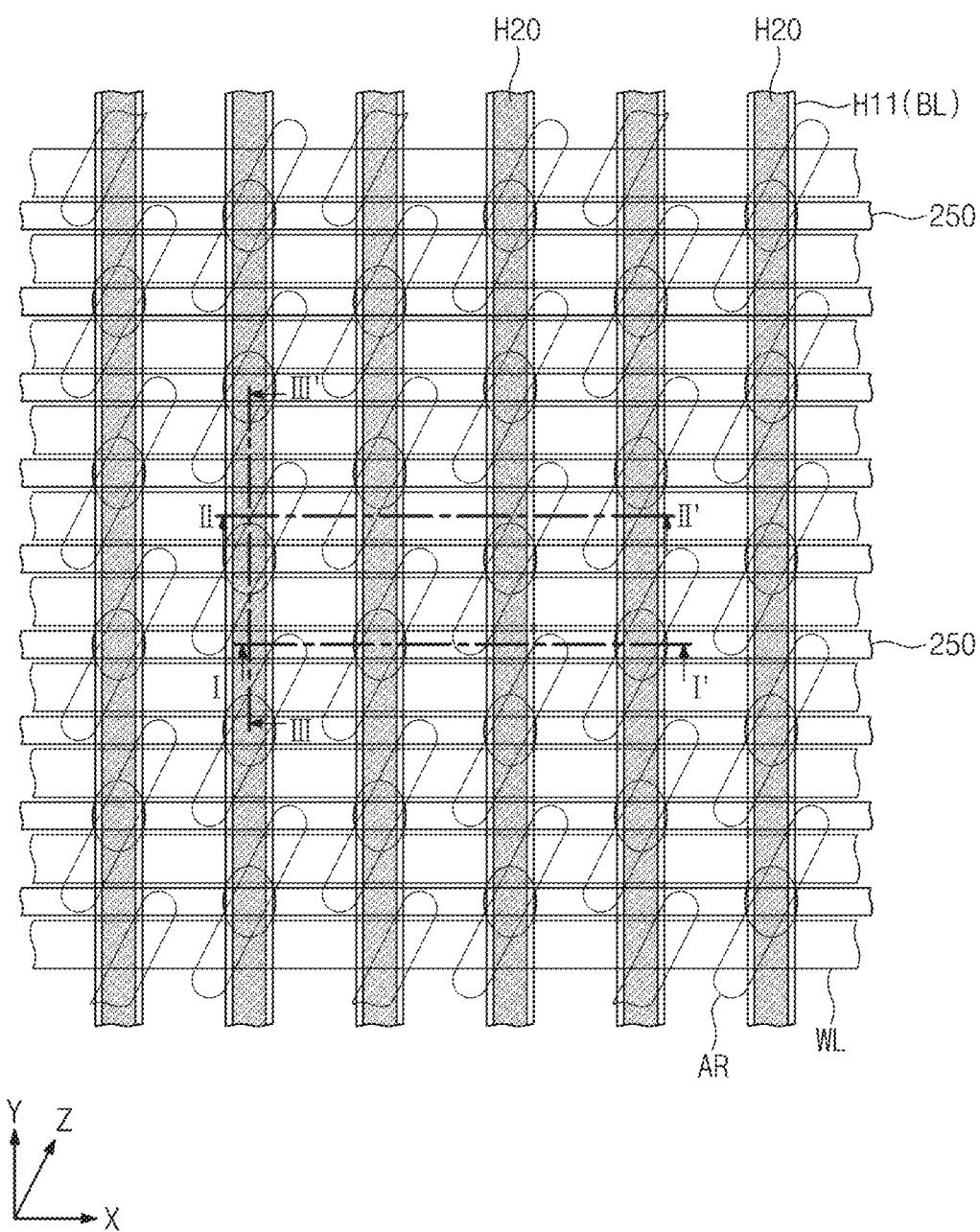
Figure 7B:
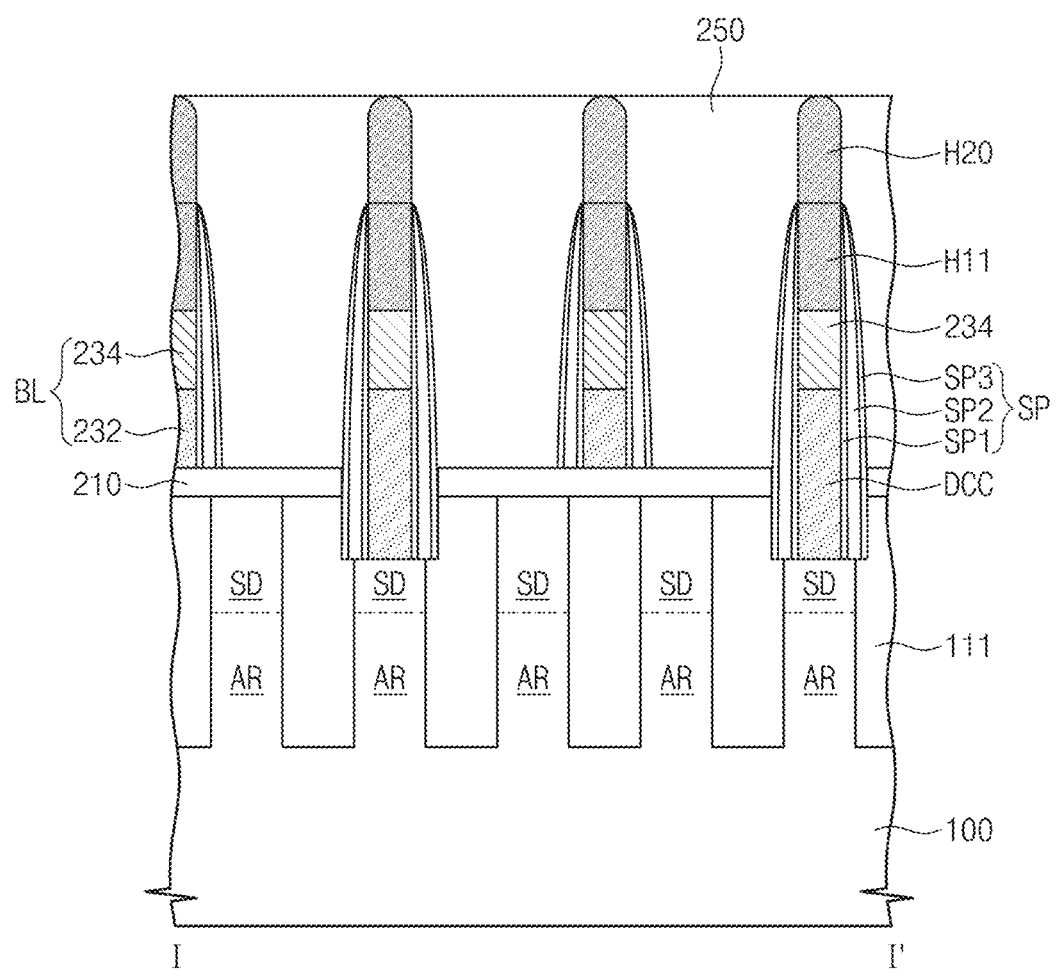
Figure 7C:
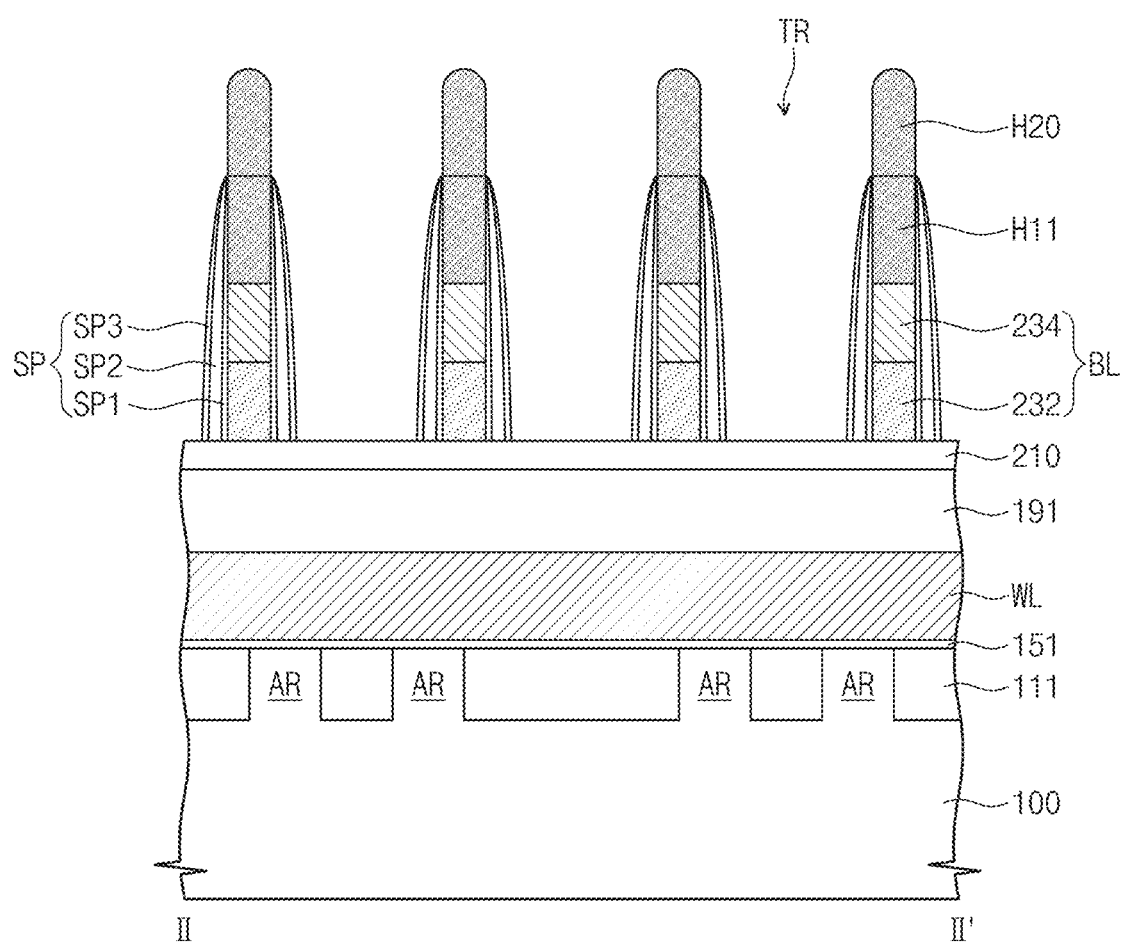
Figure 7D:
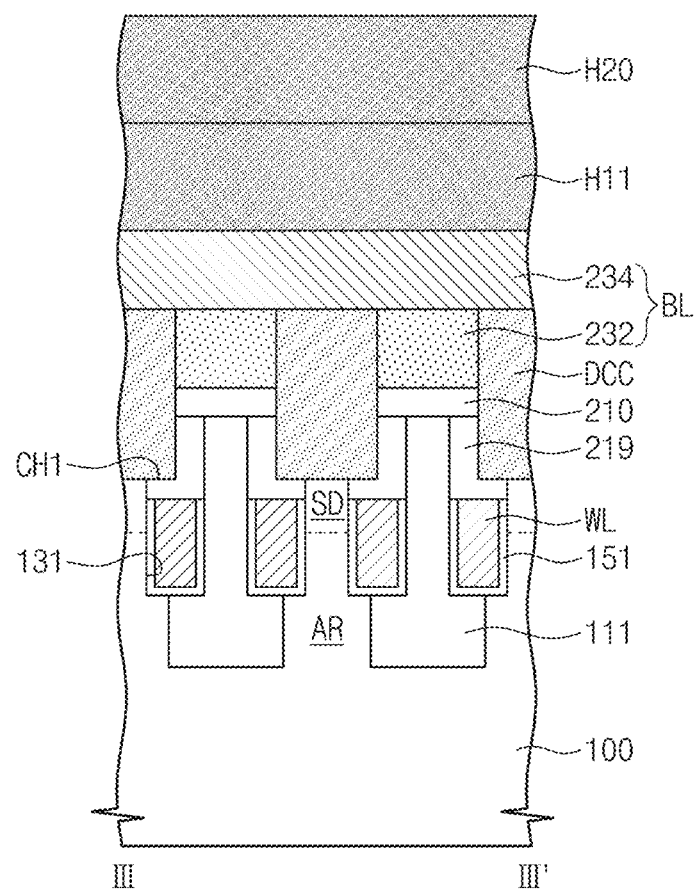
Figure 8A:
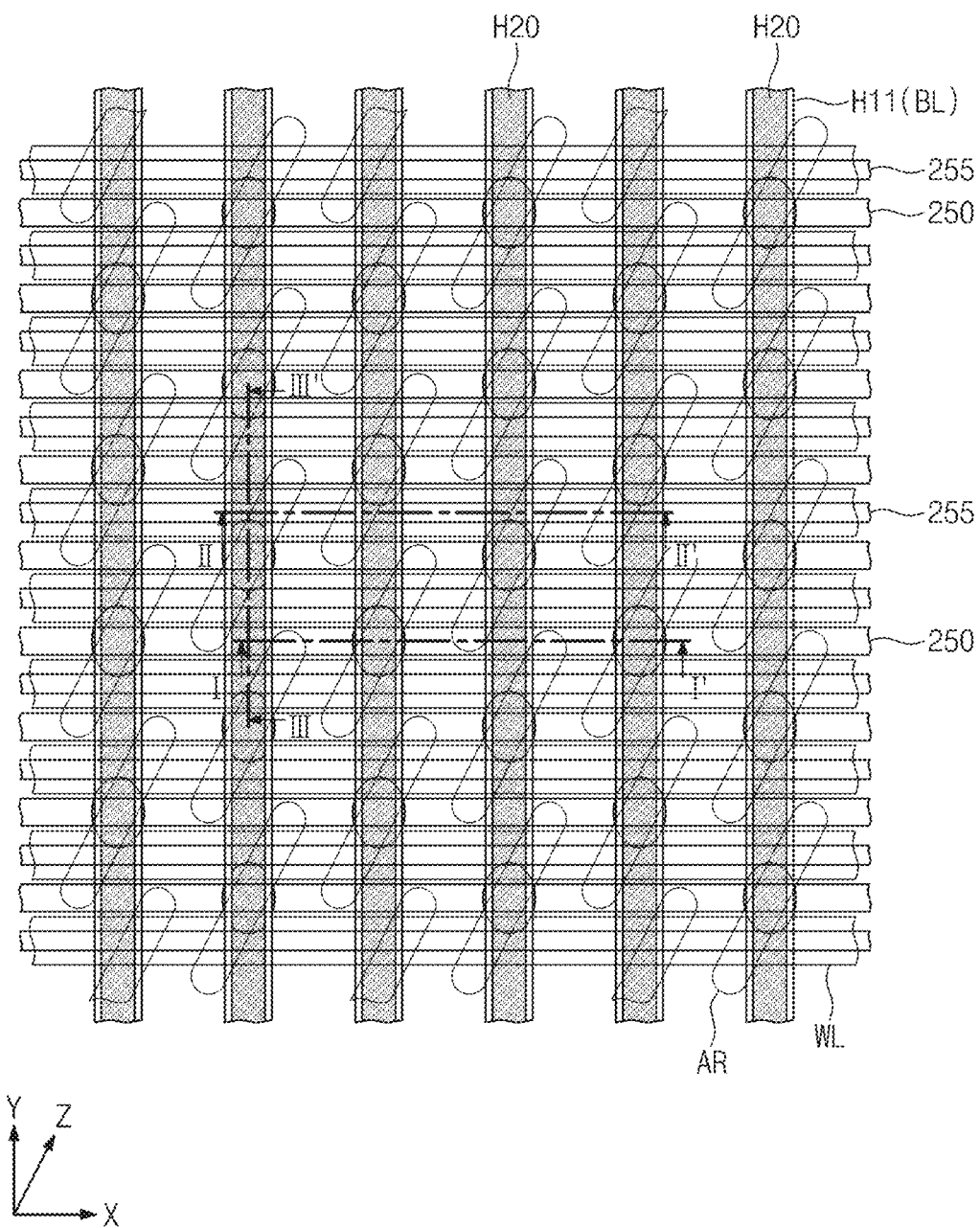
Figure 8B:
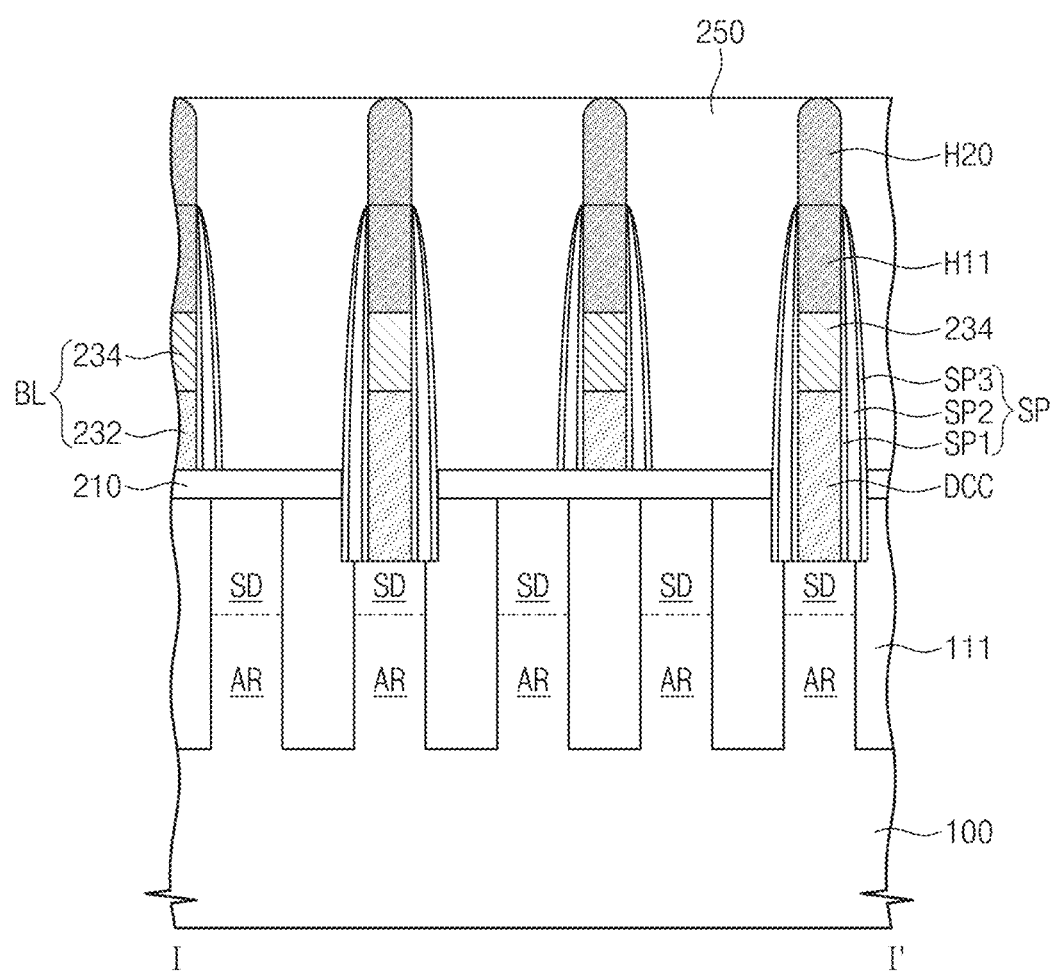
Figure 8C:
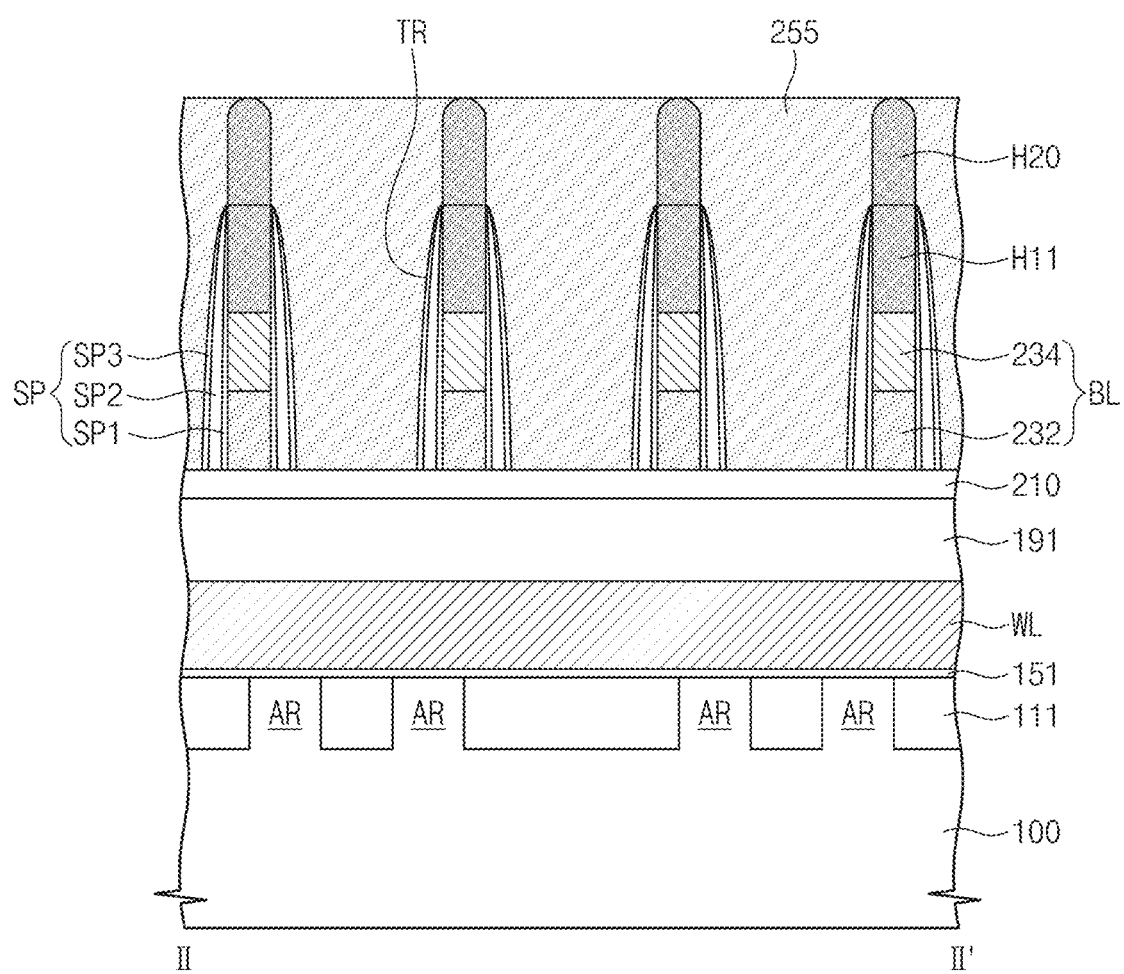
Figure 8D:
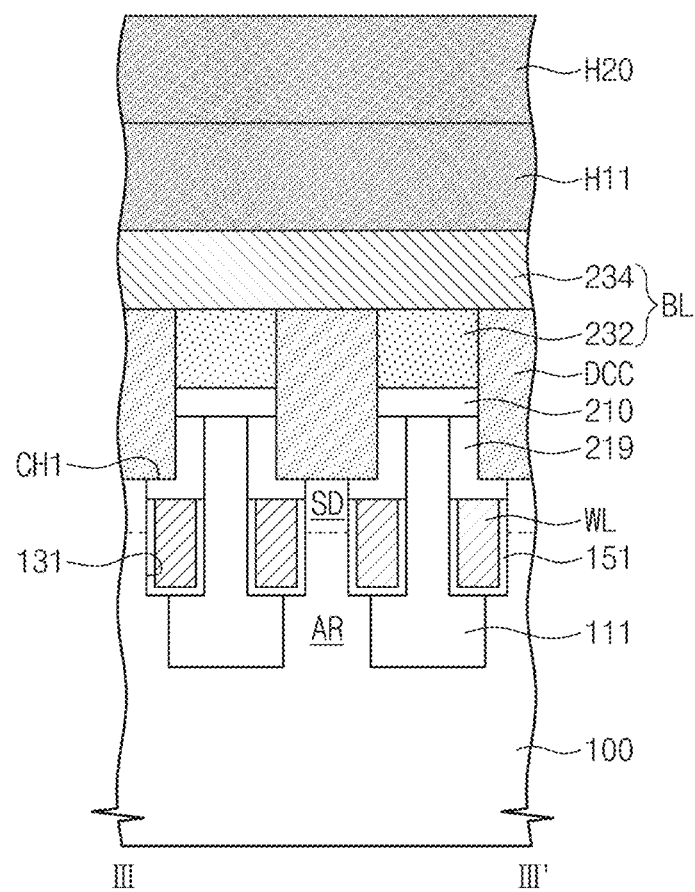
Figure 9A:
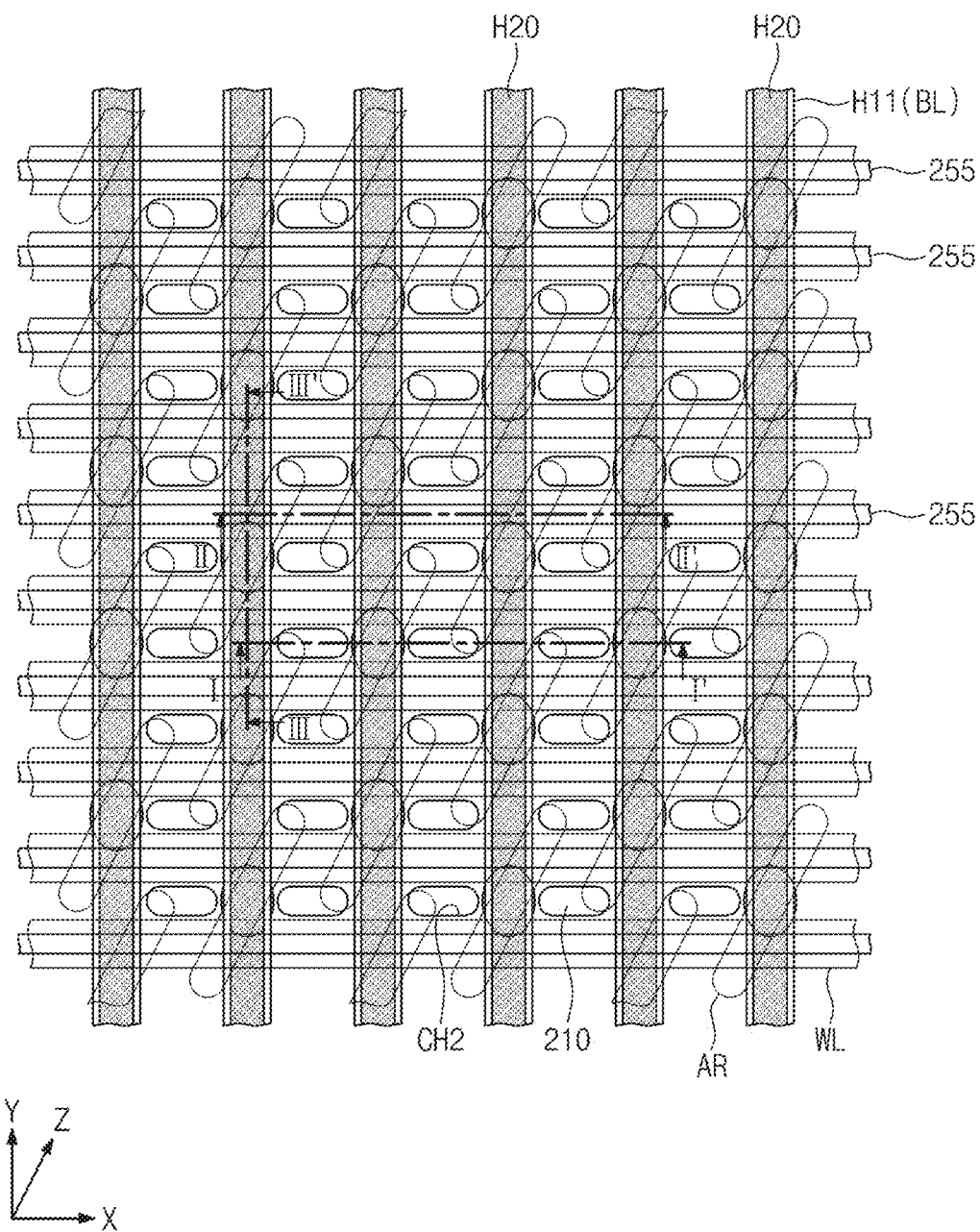
Figure 9B:
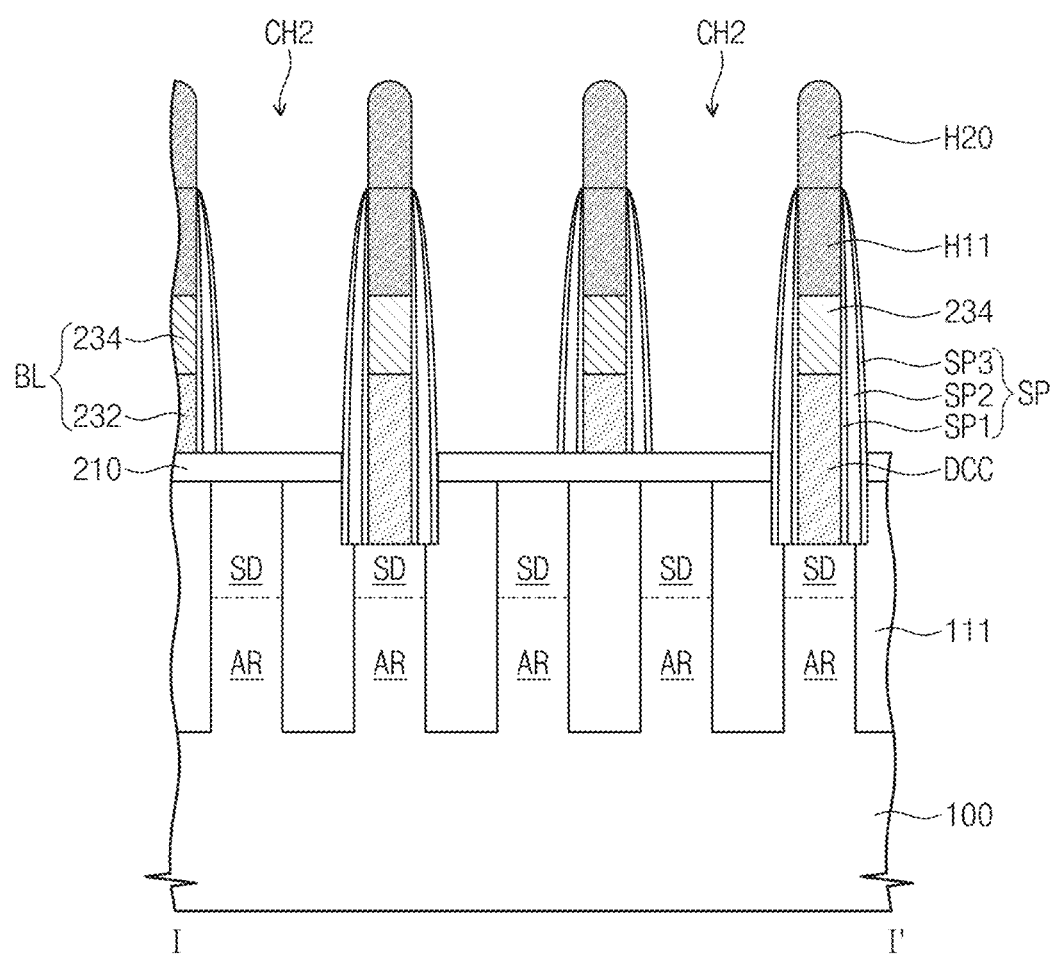
Figure 9C:
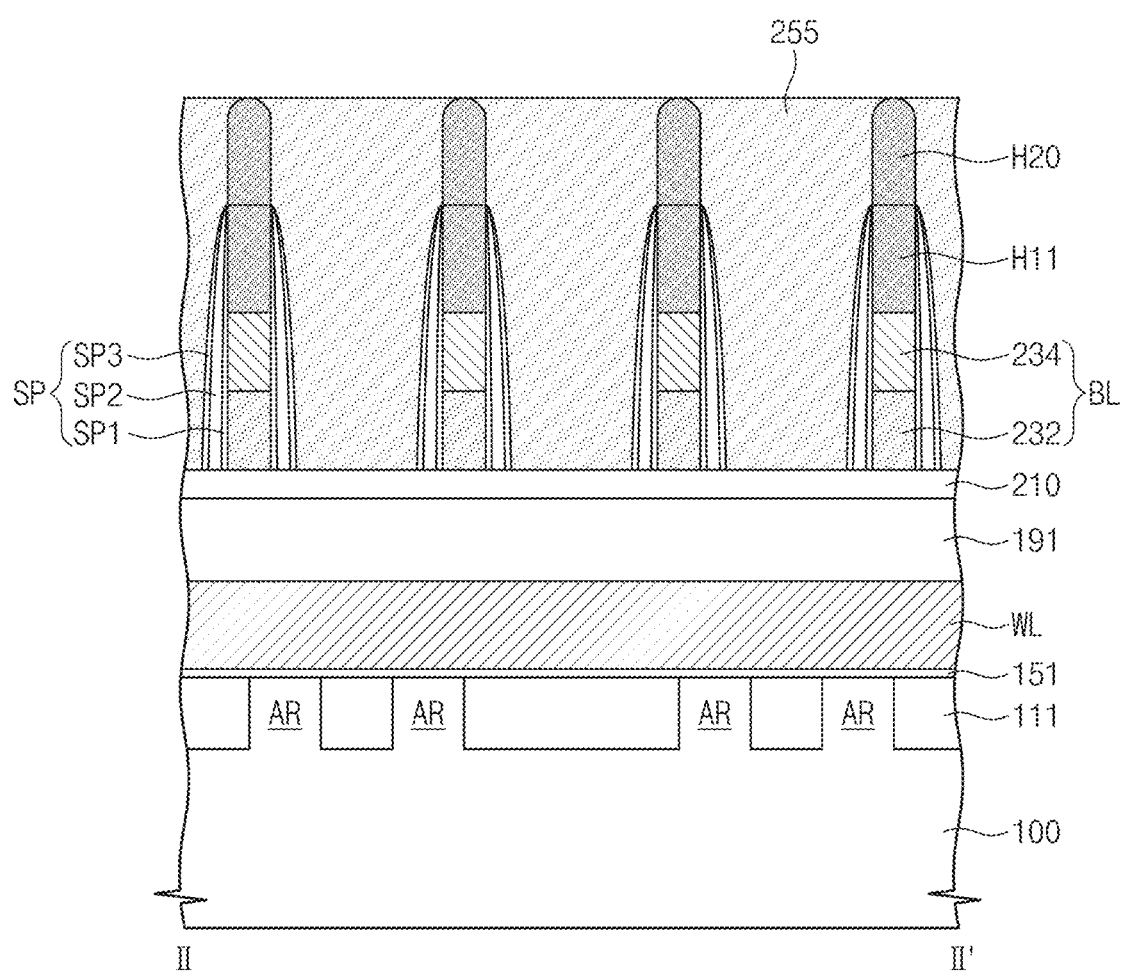
Figure 9D:
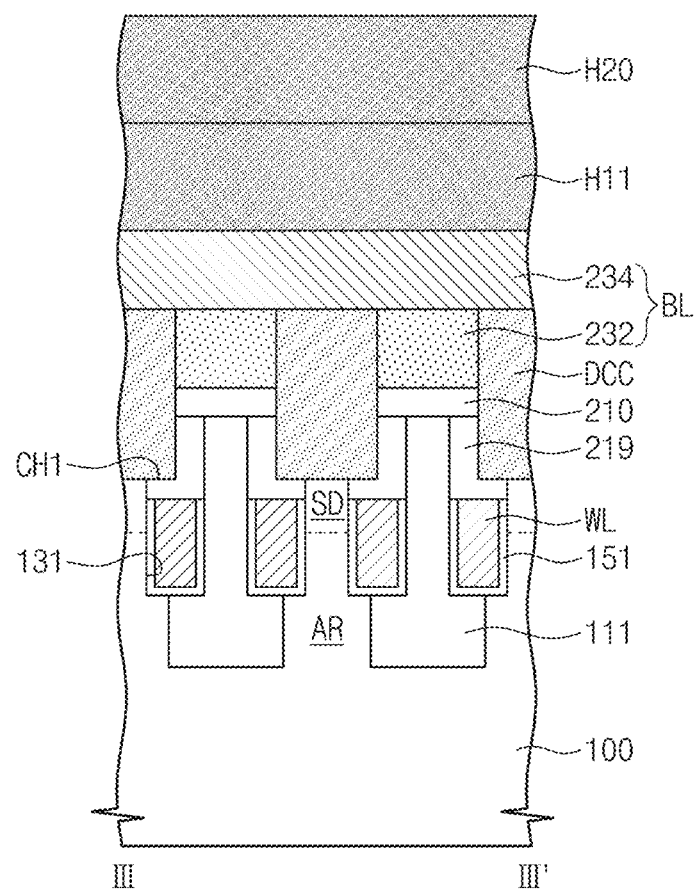
Figure 10A:
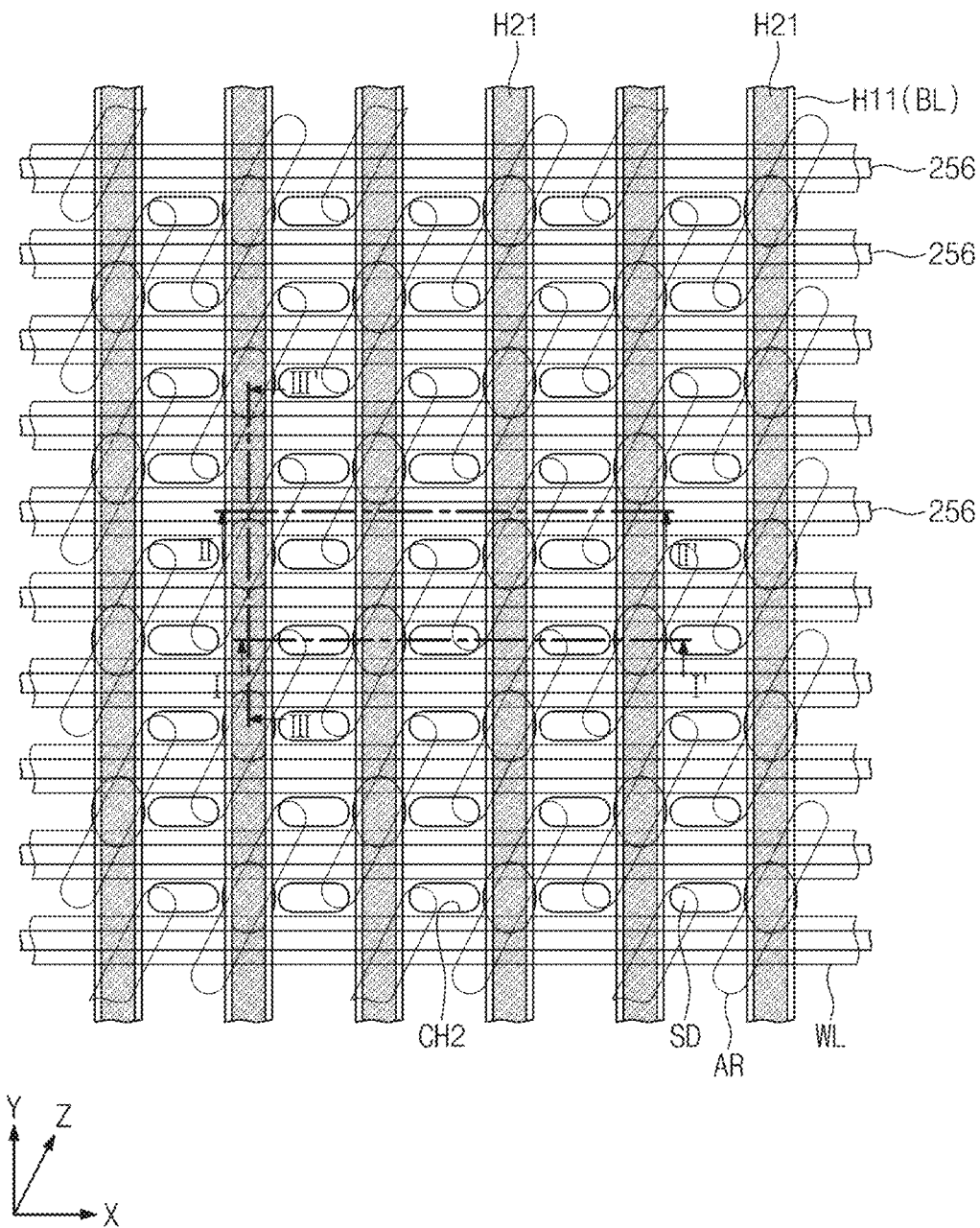
Figure 10B:
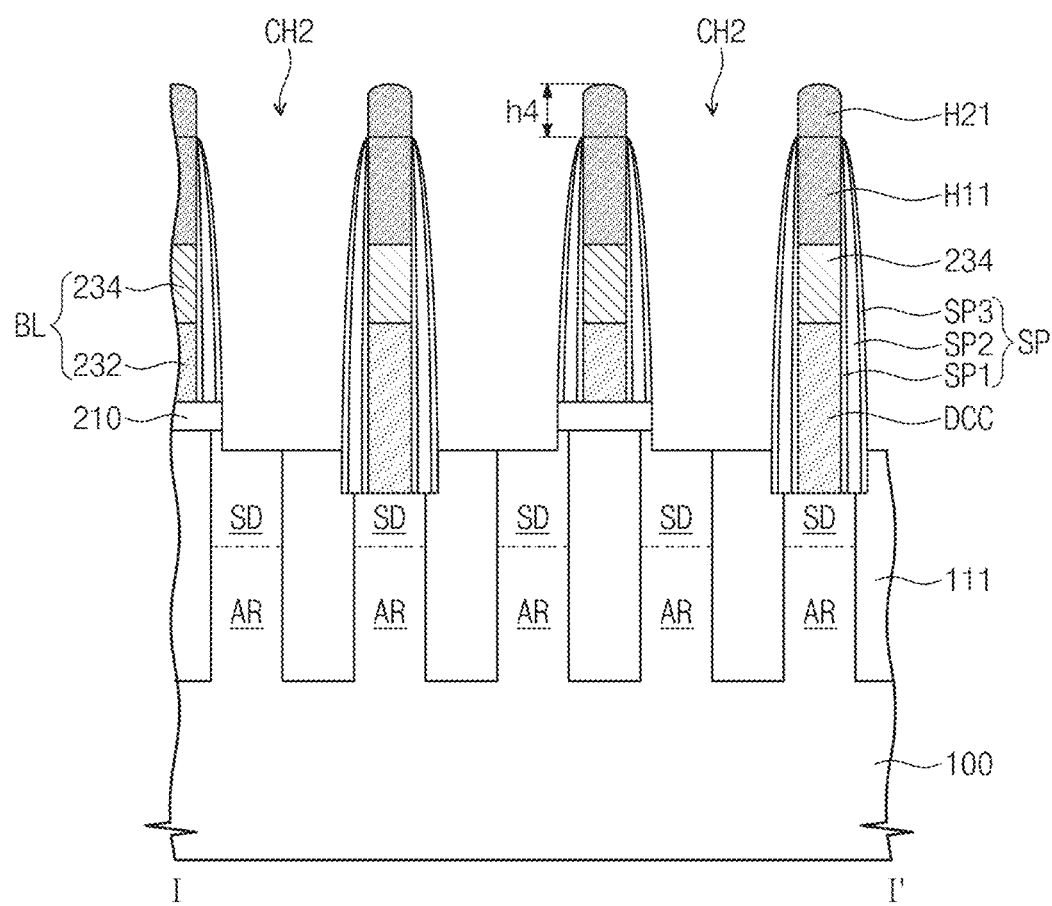
Figure 10C:
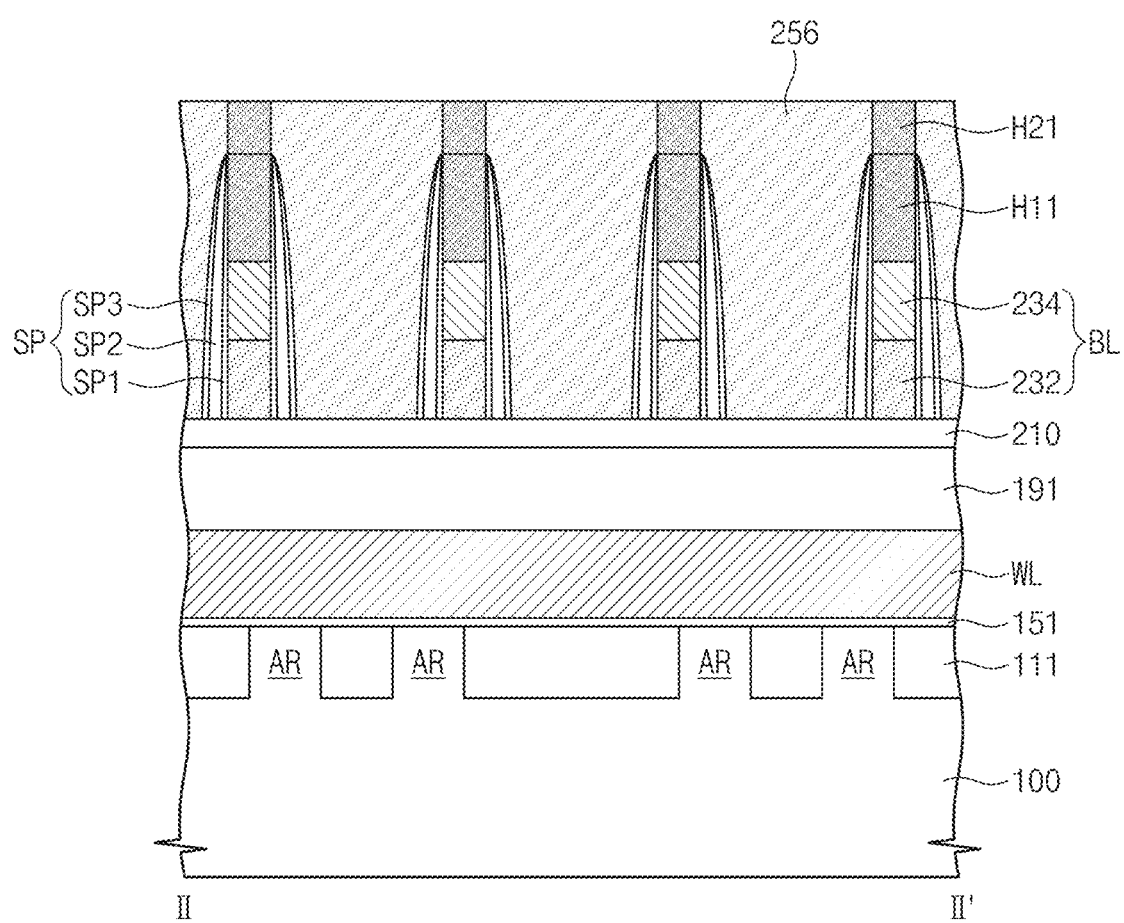
Figure 10D:
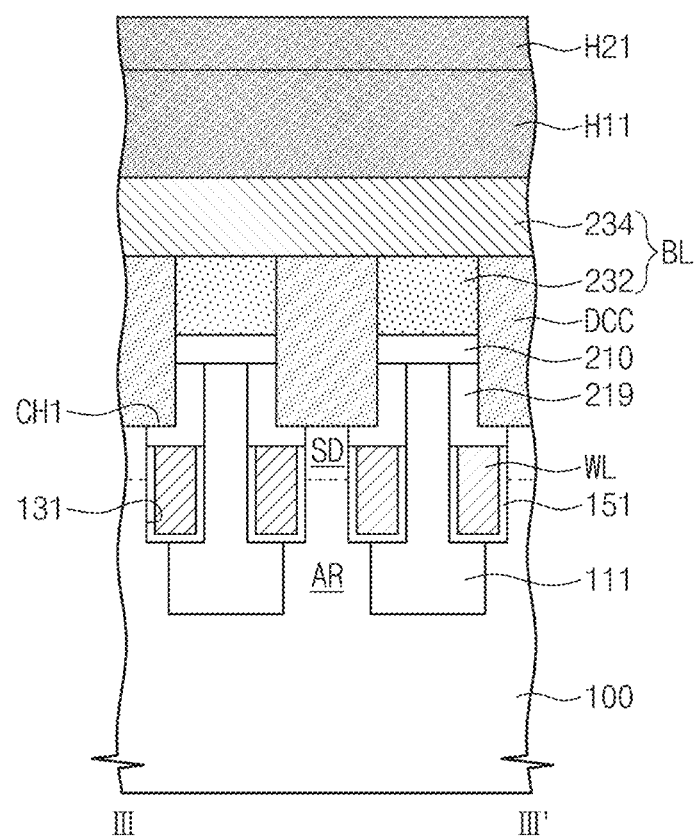
Figure 11A:
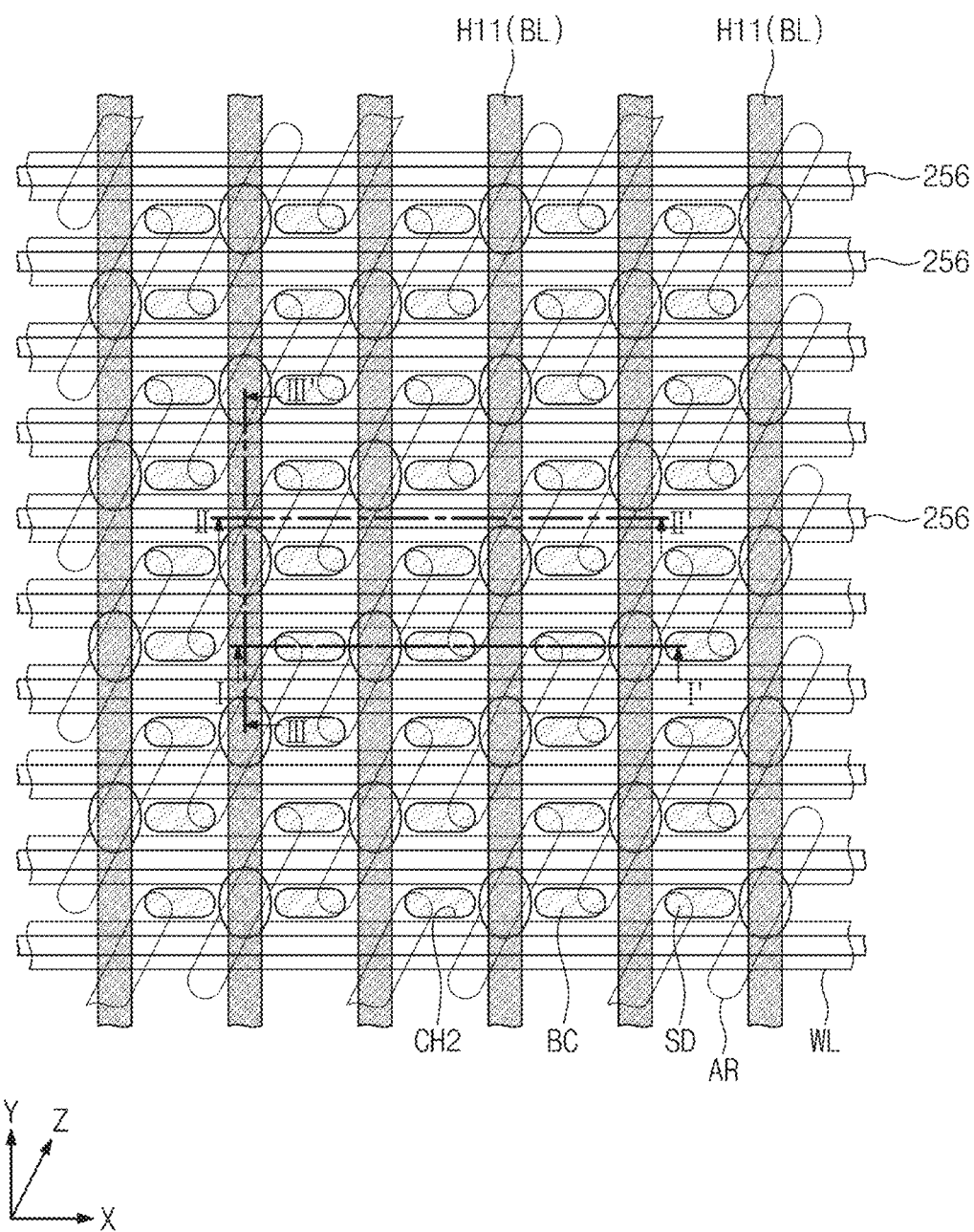
Figure 11B:
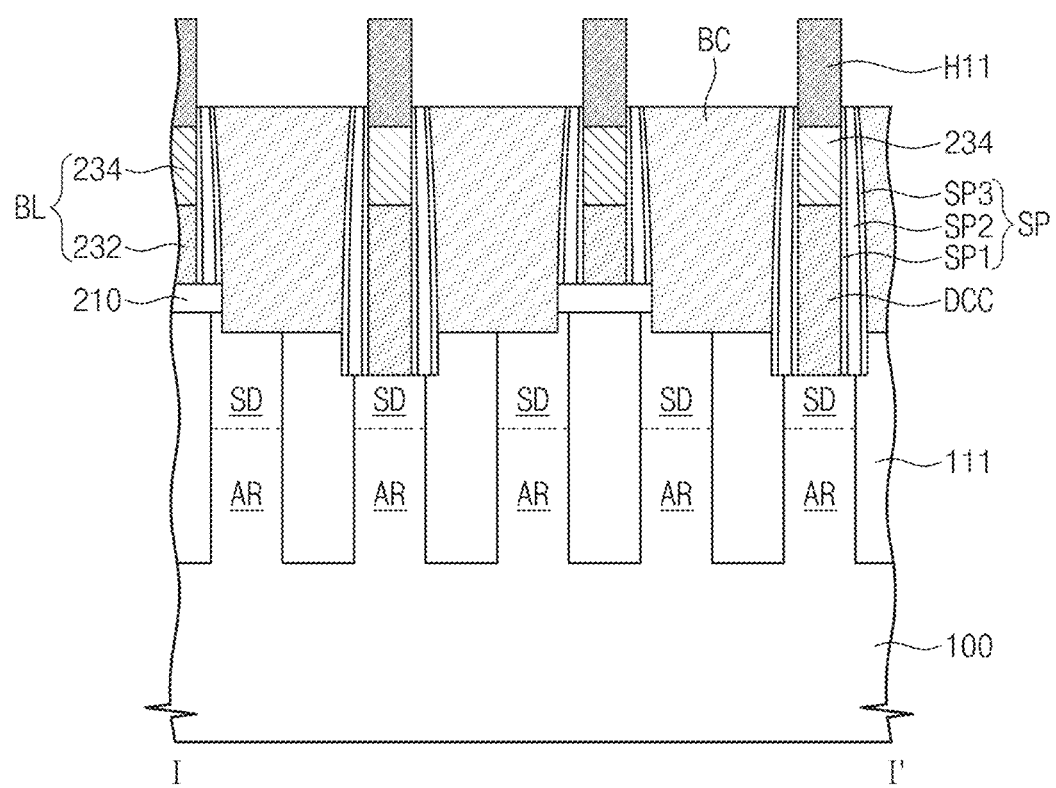
Figure 11C:
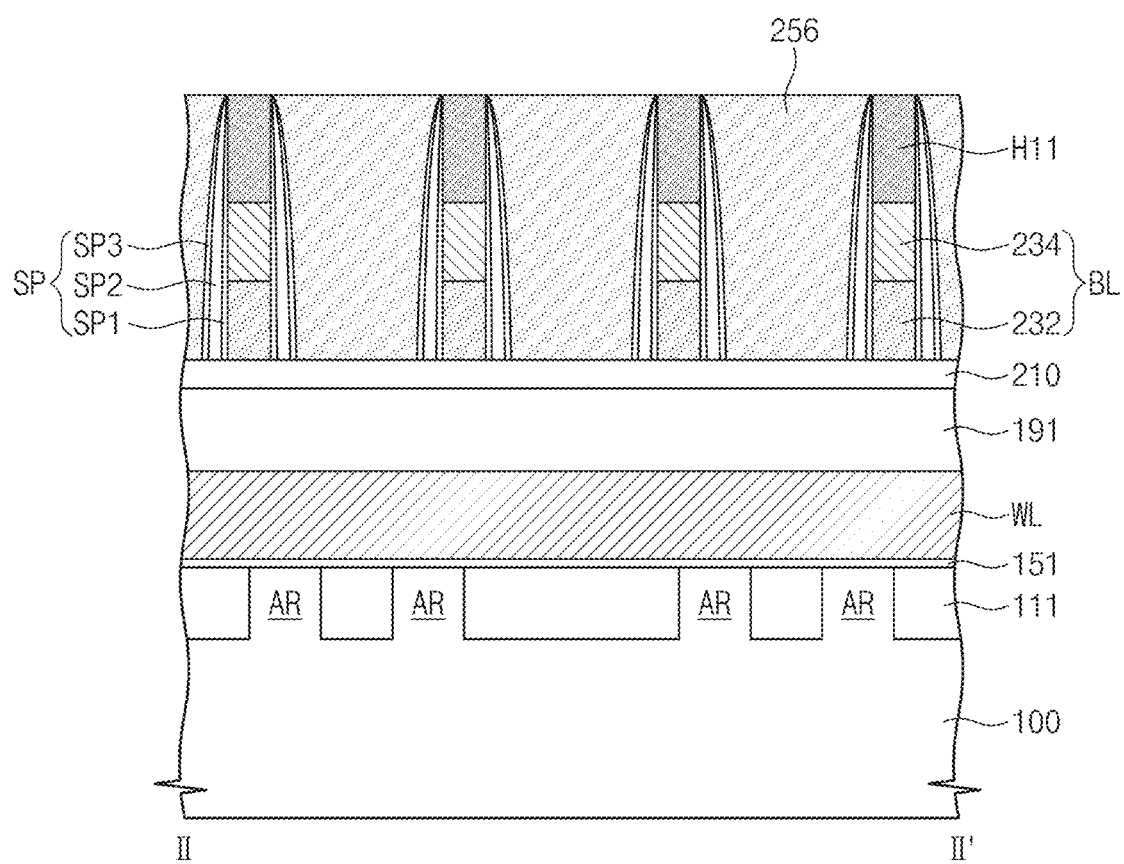
Figure 11D:
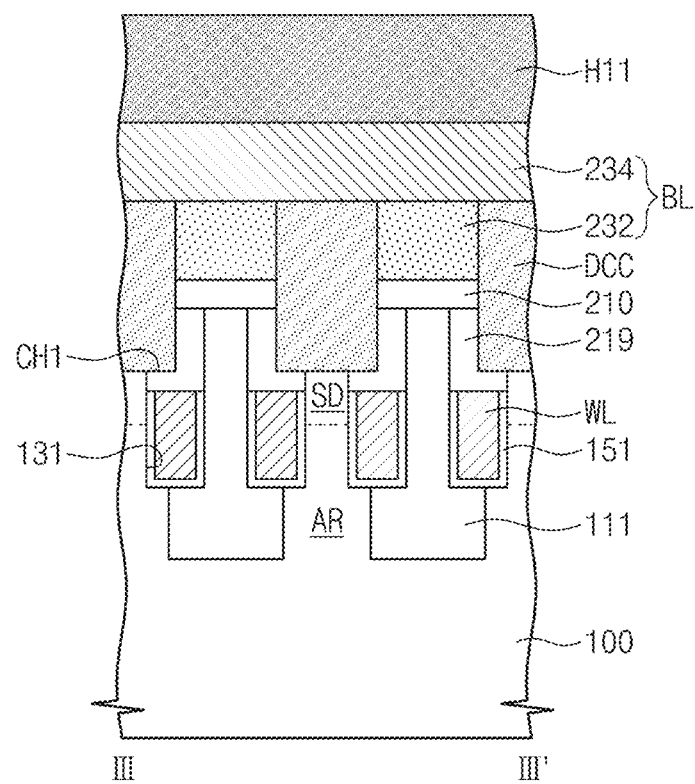
Figure 12A:
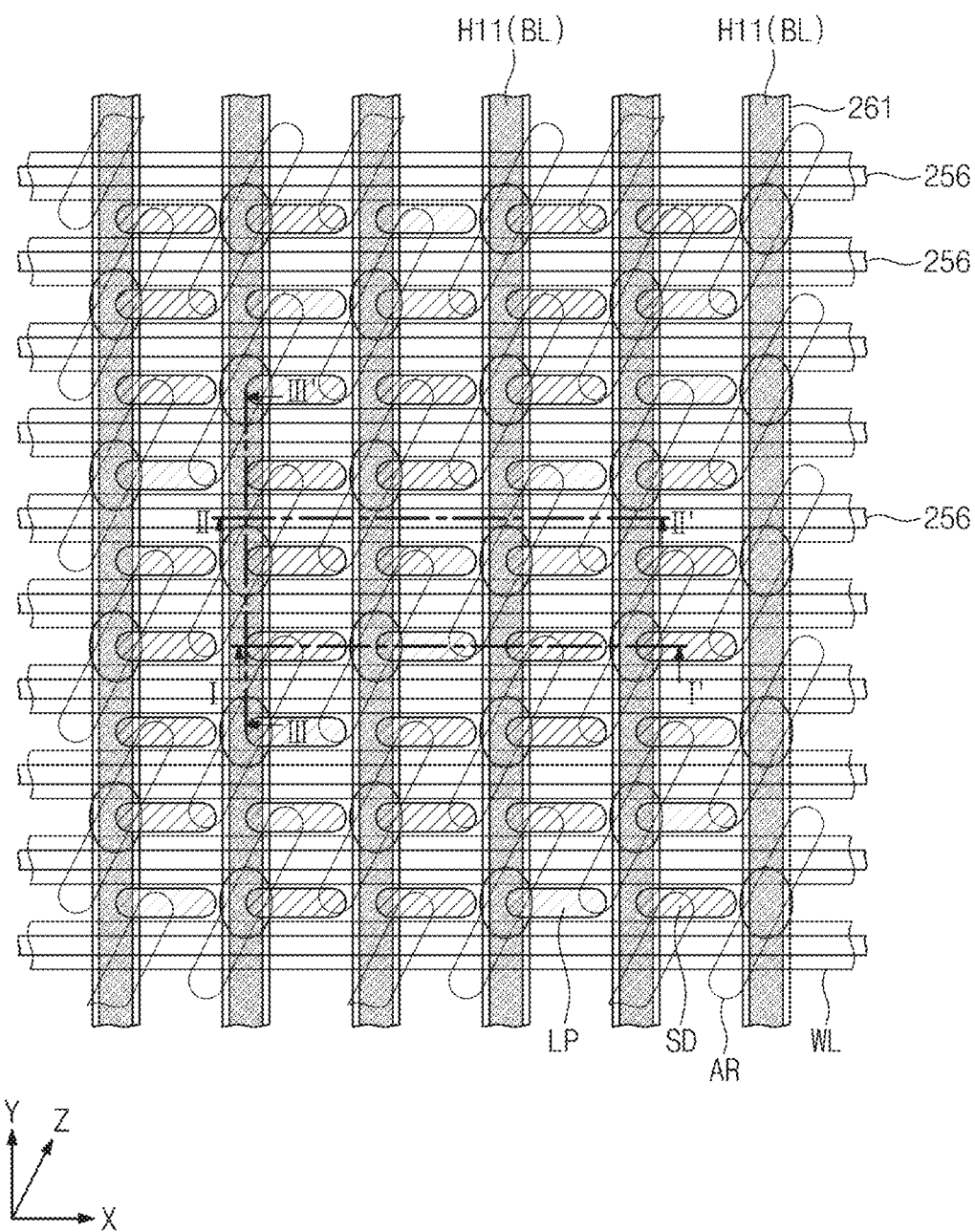
Figure 12B:
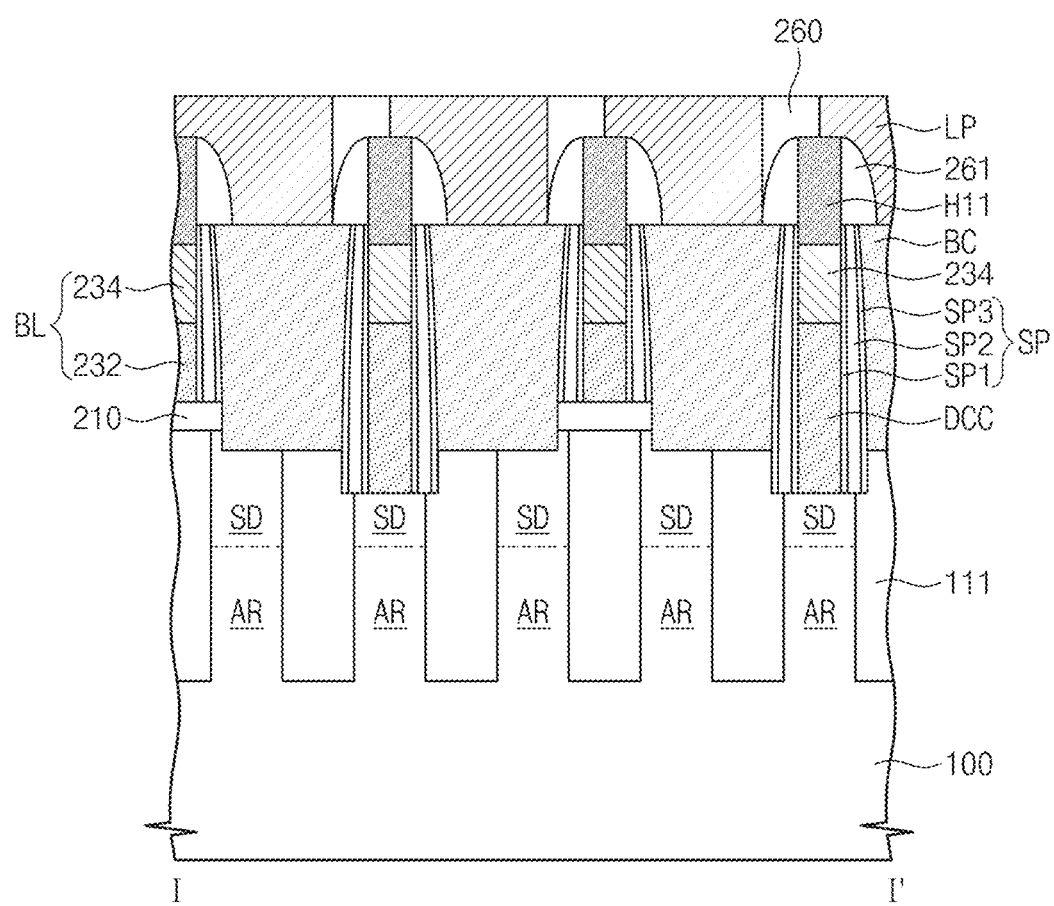
Figure 12C:
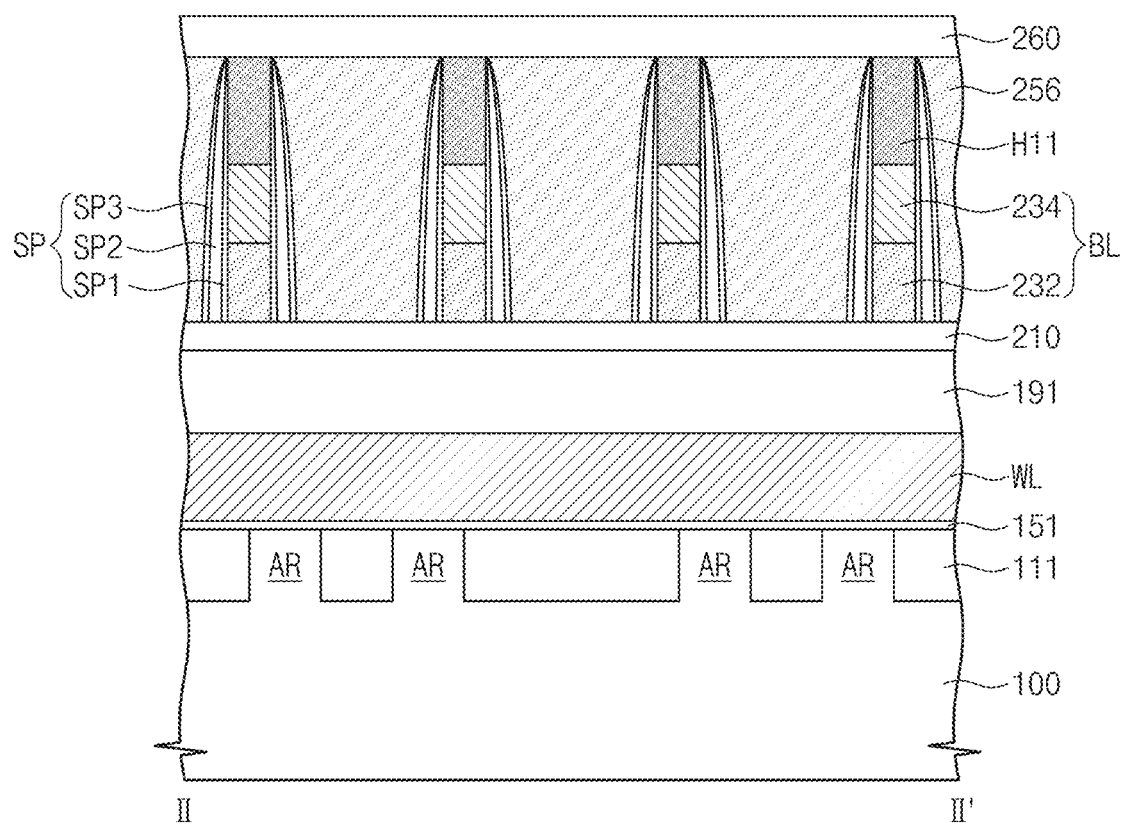
Figure 12D:
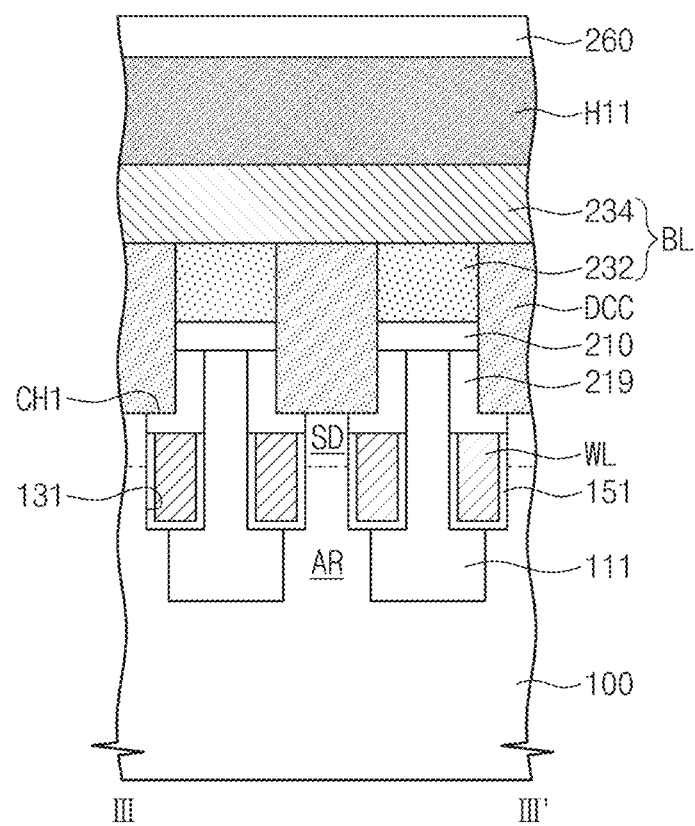
Figure 13A:
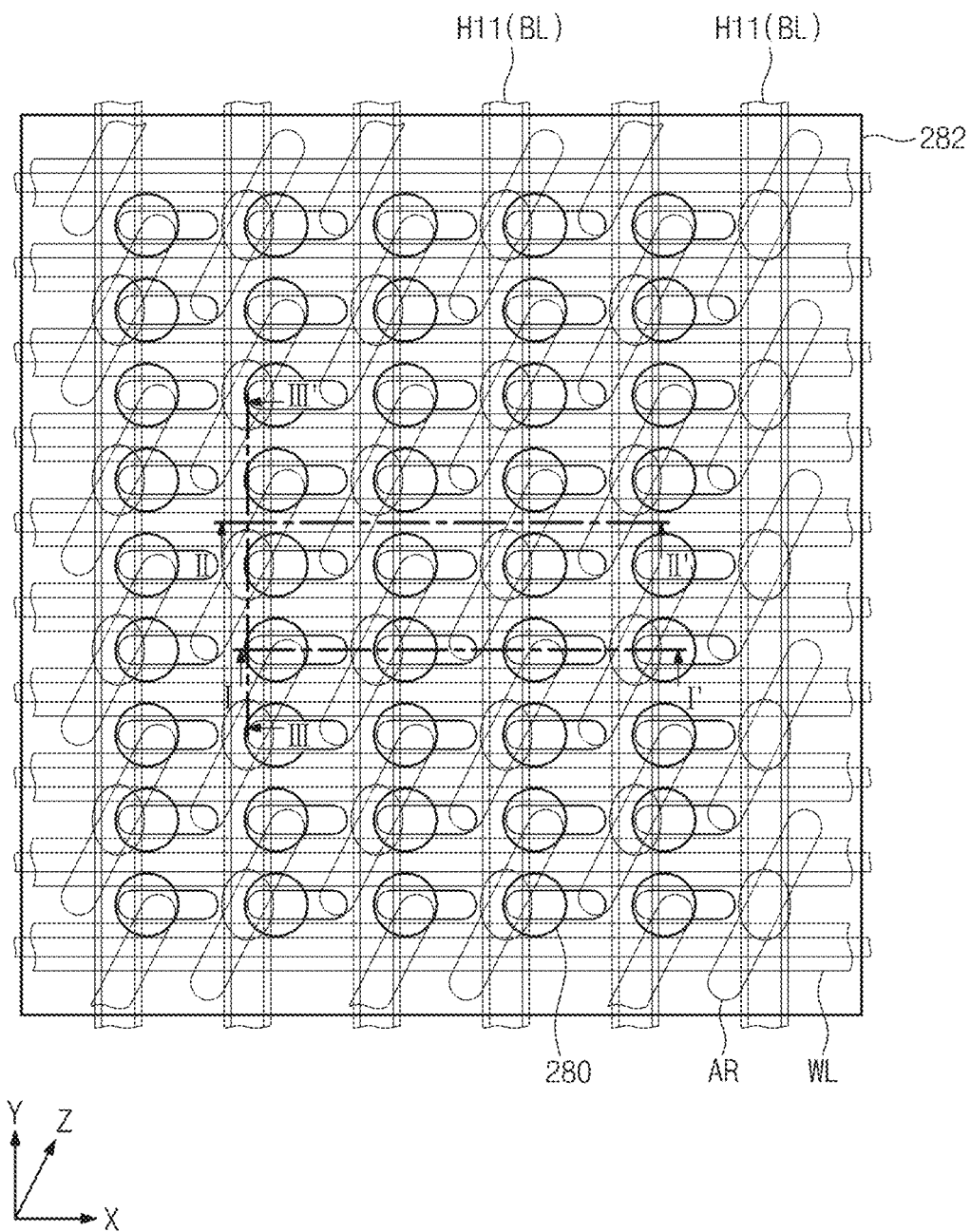
Figure 13B:
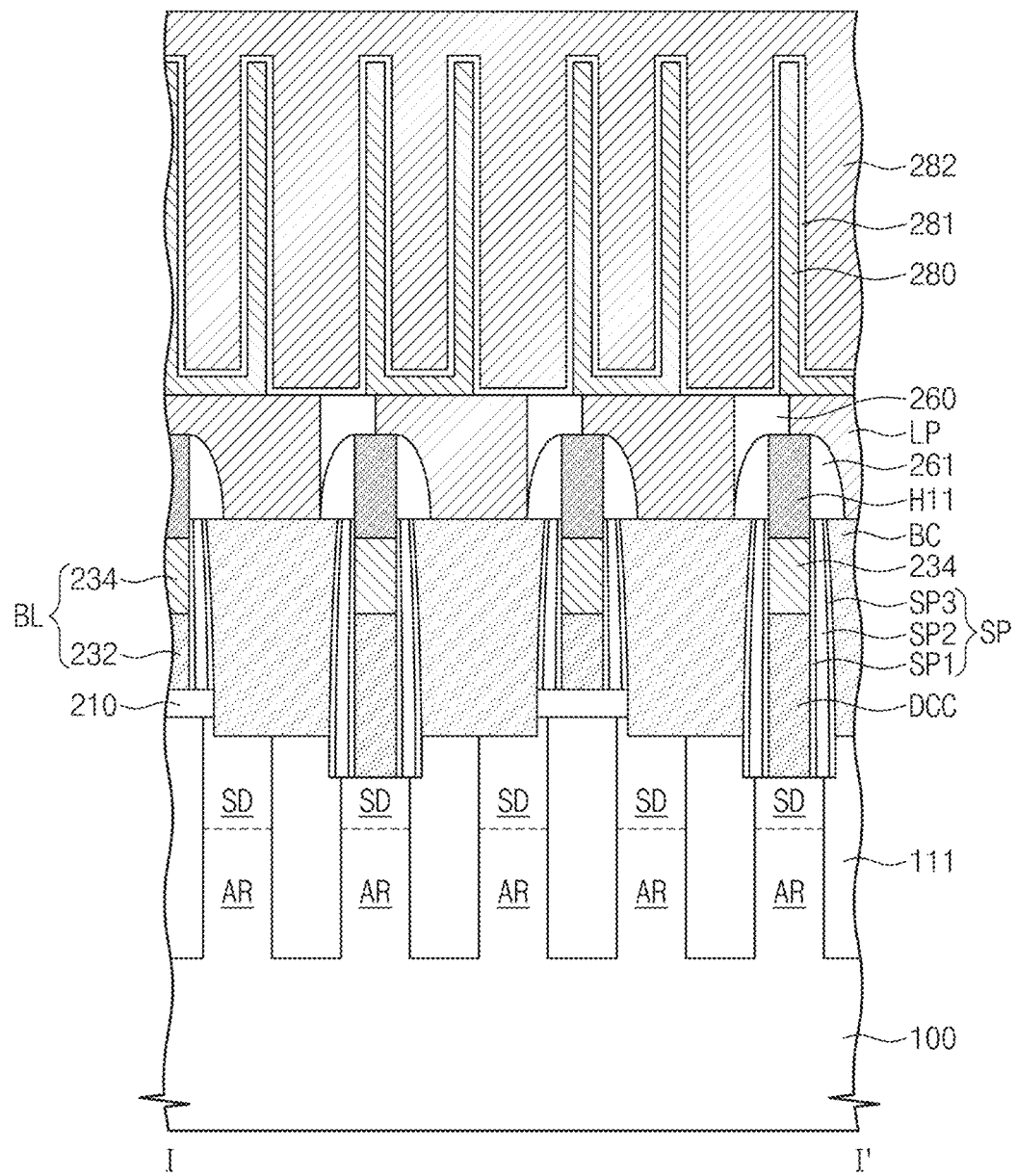
Figure 13C:
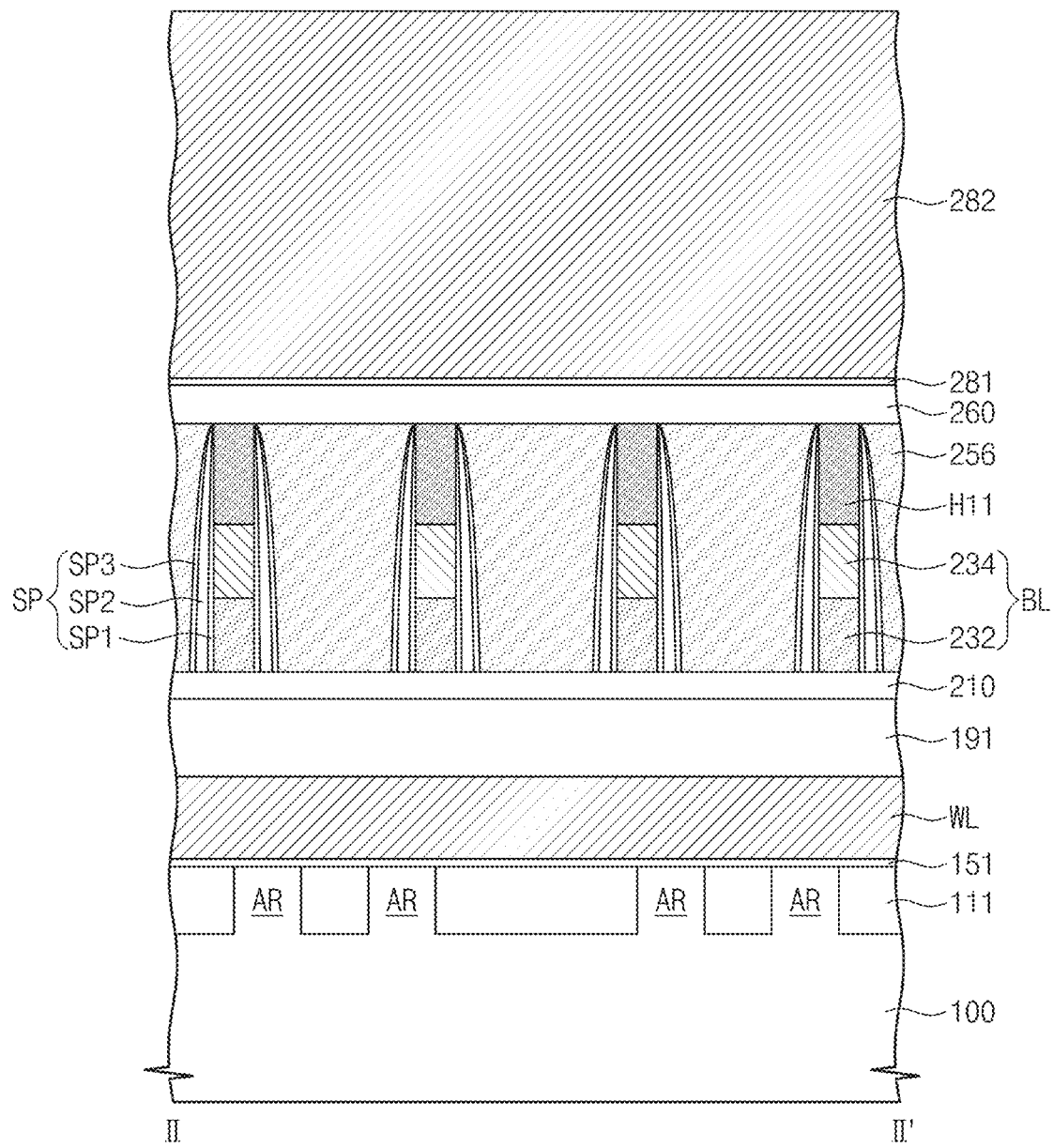
Figure 13D:
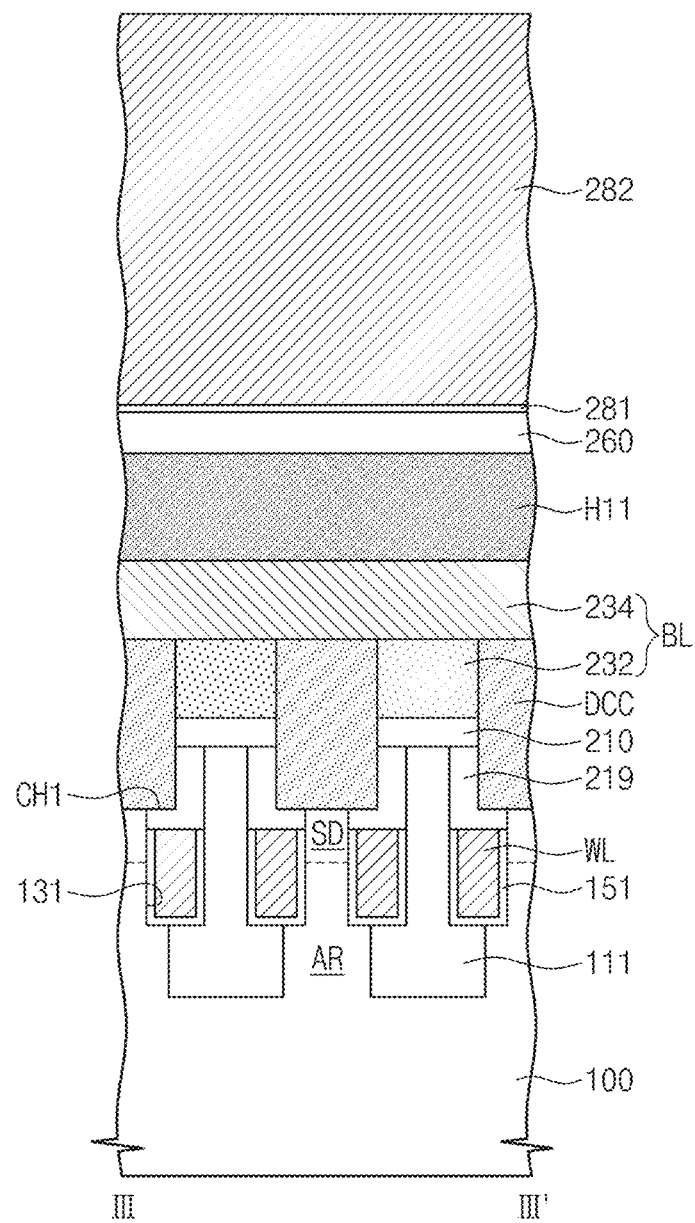

The advantages and features of the inventive concepts and methods of achieving the advantages will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art understand the inventive concepts. In the drawings, example embodiments of the inventive concepts are not limited to the specific examples provided herein and are exaggerated for clarity. The same reference numerals or the same reference designators denote the same elements throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Moreover, example embodiments are described herein with reference to cross-sectional views and/or plan views that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1A to 13A are plan views illustrating a method of fabricating a semiconductor device according to an example embodiment of the inventive concepts. FIGS. 1B to 13B are cross-sectional views taken along lines I-I' of FIGS. 1A to 13A, respectively, to illustrate a method of fabricating a semiconductor device according to an example embodiment of the inventive concepts. FIGS. 1C to 13C are cross-sectional views taken along lines II-II' of FIGS. 1A to 13A, respectively, to illustrate a method of fabricating a semiconductor device according to an example embodiment of the inventive concepts. FIGS. 1D to 13D are cross-sectional views taken along lines III-III' of FIGS. 1A to 13A, respectively, to illustrate a method of fabricating a semiconductor device according to an example embodiment of the inventive concepts.

Referring to FIGS. 1A, 1B, 1C, and 1D, a device isolation layer 111 may be formed in a substrate 100 to define active regions AR. A trench (not shown) may be formed in the substrate 100, and the trench may be filled with an insulating material to form the device isolation layer 111. Each or one or more of the active regions AR may have a bar shape extending in one direction Z (hereinafter, referred to as 'a third direction Z'). The active regions AR may be disposed in parallel to each other. The substrate 100 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. For example, the device isolation layer 111 may include at least one of silicon oxide, silicon nitride, or silicon oxynitride.

Referring to FIGS. 2A, 2B, 2C, and 2D, source/drain regions SD may be formed in upper portions of the active regions AR. The source/drain regions SD may be formed by, for example, an ion implantation process using the device isolation layer 111 as an ion implantation mask. A conductivity type of the source/drain regions SD may be different from that of the substrate 100.

Trenches 131 may be formed in the substrate 100. Two trenches 131 may be formed to intersect each or one or more of the active regions AR in a first direction X. The trenches 131 may be arranged along a second direction Y intersecting the first direction X and may be parallel to each other. A gate insulating layer 151 may be formed to conformally cover inner surfaces of the trenches 131. Word lines WL may be formed on the gate insulating layer 151 to fill the trenches 131, respectively. The gate insulating layer 151 may include an insulating material, for example, at least one of a silicon oxide layer, a silicon oxynitride layer, or high-k dielectric layers. The word lines WL may include a conductive material. For example, the word lines WL may include at least one of doped poly-crystalline silicon, a metal material, or a conductive metal nitride.

The gate insulating layer 151 and portions of the word lines WL which are formed in upper regions of the trenches 131 may be removed, and capping patterns 191 may be formed in the trenches 191, respectively. The capping patterns 191 may be respectively formed on the word lines WL and may substantially completely fill the trenches 131. The capping patterns 191 may include at least one of silicon oxide, silicon nitride, or silicon oxynitride.

Referring to FIGS. 3A, 3B, 3C, and 3D, a buffer layer 210 may be formed on the substrate 100. The buffer layer 210 may be formed of or include one or more insulating layers. For example, the buffer layer 210 may be a single layer or multi-layer including at least one of a silicon oxide layer, a silicon nitride layer, or a silicon oxynitride layer. A semiconductor layer 231 may be formed on the buffer layer 210. For example, the semiconductor layer 231 may be an undoped poly-crystalline silicon layer. Each or one or more of the buffer layer 210 and the semiconductor layer 231 may be formed by a chemical vapor deposition (CVD) process and/or a physical vapor deposition (PVD) process.

A mask pattern (not shown) exposing portions of the semiconductor layer 231 may be formed on the semiconductor layer 231. An etching process may be performed to pattern the semiconductor layer 231 exposed by the mask pattern. The exposed portions of the semiconductor layer 231, portions of the buffer layer 210, and portions of an upper portion of the substrate 100 may be etched by the etching process to form first contact holes CH1 on the active regions AR. Each or one or more of the first contact holes CH1 may expose the source/drain region SD formed in each active region AR between a pair of word lines WL overlapping each active region AR when viewed from a plan view. Portions of an upper portion of the device isolation layer 111 adjacent to the source/drain regions SD may also be etched when the first contact holes CH1 are formed.

Contact patterns 215 may be formed in the first contact holes CH1, respectively. The contact patterns 215 may substantially completely fill the first contact holes CH1, respectively. In an example embodiment, a doped semiconductor layer may be formed on the semiconductor layer 231 to fill the first contact holes CH1, and a planarization process (e.g., a chemical mechanical polishing (CMP) process or an etch-back process) may be performed on the doped semiconductor layer until a top surface of the semiconductor layer 231, or a surface of the semiconductor layer 231 that is opposite to the substrate 100, is exposed, thereby forming the contact patterns 215. In an example embodiment, the contact patterns 215 may include N-type or P-type doped poly-crystalline silicon.

Referring to FIGS. 4A, 4B, 4C, and 4D, a conductive layer 233 may be formed on the semiconductor layer 231 in which the contact patterns 215 are formed. The conductive layer 233 may include one or more conductive layers. For example, the conductive layer 233 may include tungsten (W), aluminum (Al), copper (Cu), nickel (Ni), or cobalt (Co). Even though not shown in the drawings, a diffusion preventing layer may be formed between the conductive layer 233 and the semiconductor layer 231. The diffusion preventing layer may correspond to a diffusion barrier metal and may include, for example, at least one of titanium nitride (TiN), titanium/titanium nitride (Ti/TiN), titanium-silicon nitride (TiSiN), tantalum nitride (TaN), or tungsten nitride (WN).

First mask patterns H10 may be formed on the conductive layer 233. The first mask patterns H10 may have line shapes extending in a direction intersecting the word lines WL. In an example embodiment, the first mask patterns H10 may extend in the second direction Y and may be arranged along the first direction X. Each or one or more of the first mask patterns H10 may overlap with the contact patterns 215 arranged along the second direction Y. In an example embodiment, an insulating layer may be formed on the conductive layer 233, and an etching process using photoresist patterns may be performed on the insulating layer to form the first mask patterns H10. The photoresist patterns may be removed by an ashing process. The first mask patterns H10 may include at least one of silicon nitride, silicon oxide, or silicon oxynitride. Each or one or more of the first mask patterns H10 may have a first thickness h1 and a first width w1. In an example embodiment, the first thickness h1 may be five or more times greater than a thickness of the conductive layer 233. The first width w1 may be equal to or less than about one-third of the first thickness h1. For example, the first thickness h1 may range from about 700 Å to about 2000 Å.

Referring to FIGS. 5A, 5B, 5C, and 5D, the conductive layer 233, the semiconductor layer 231, and the contact patterns 215 may be patterned using the first mask patterns H10 as an etch mask to form bit lines BL and bit line node contacts DCC. The patterning process may include a physical etching process and/or a chemical etching process. Portions of a top surface of the buffer layer 210 may be exposed by the patterning process. Each or one or more of the bit lines BL may include a semiconductor pattern 232 and a conductive pattern 234 which are stacked, for example, sequentially stacked on the substrate 100. The conductive patterns 234 may be electrically connected to the source/drain regions SD through the bit line node contacts DCC. Each or one or more of the bit lines BL may extend in the second direction Y to pass on the bit line node contacts DCC arranged in the second direction Y. The bit lines BL may be arranged in the first direction X.

Upper portions of the first mask patterns H10 of FIGS. 4A to 4D may be removed by the patterning process to form first mask patterns H11 of FIGS. 5A to 5D. As a result, each or one or more of the first mask patterns H11 of FIGS. 5A to 5D may have a second thickness h2 that is smaller than the first thickness h1. In an example embodiment, the second thickness h2 may range from about 50% to about 85% of the first thickness h1.

Spacers SP may be formed to cover sidewalls of the first mask patterns H11, sidewalls of the bit lines BL, and sidewalls of the bit line node contacts DCC. Each or one or more of the spacers SP may include first, second and third spacers SP1, SP2 and SP3. The first spacer SP1 may cover the sidewalls of the first mask pattern H11, the bit line BL and the bit line node contact DCC. The second spacer SP2 may be formed on the first spacer SP1, and the third spacer SP3 may be formed on the second spacer SP2. In an example embodiment, a first insulating layer (not shown), a second insulating layer (not shown), and a third insulating layer (not shown) may be formed, for example, sequentially formed on the substrate 100, and an anisotropic etching process may be performed on the third, second and first insulating layers to form the spacers SP. Top surfaces of the first mask patterns H11 may be exposed by the anisotropic etching process. Upper portions of the first mask patterns H11 may be removed by the anisotropic etching process. Lower portions of the spacers SP may fill portions of the first contact holes CHL which are not filled with the bit line node contacts DCC. Unlike FIGS. 5B and 5C, the first spacer SP1 may extend onto a bottom surface of the second spacer SP2. The first spacer SP1 may be formed of or include a material having an etch selectivity with respect to the second and third spacers SP2 and SP3. For example, the first spacer layer SP1 may include at least one of a SiBCN layer, a SiBN layer, a SiOCN layer, or a SiN layer. The second spacer SP2 may be formed of or include a material having an etch selectivity with respect to the third spacer SP3. For example, the second spacer SP2 may include a silicon oxide ($SiO_2$) layer. For example, the third spacer SP3 may include a silicon nitride (SiN) layer.

Referring to FIGS. 6A, 6B, 6C, and 6D, second mask patterns H20 extending along the first mask patterns H11 may be formed on the first mask patterns H11, respectively. The second mask patterns H20 may have line shapes aligned with the first mask patterns H11 having the line shapes. The second mask patterns H20 may be formed to be in contact with top surfaces of the first mask patterns H11, respectively. Each or one or more of the second mask patterns H20 may have a third thickness h3. The third thickness h3 may range from about 25% to about 50% of the first thickness h1 of the first mask patterns H10 described with reference to FIGS. 4A to 4D.

The second mask patterns H20 may be, for example, locally grown on the top surfaces of the first mask patterns H11 without an additional photolithography process. Hereinafter, a process of forming the second mask patterns H20 will be described in more detail.

Figure 14:
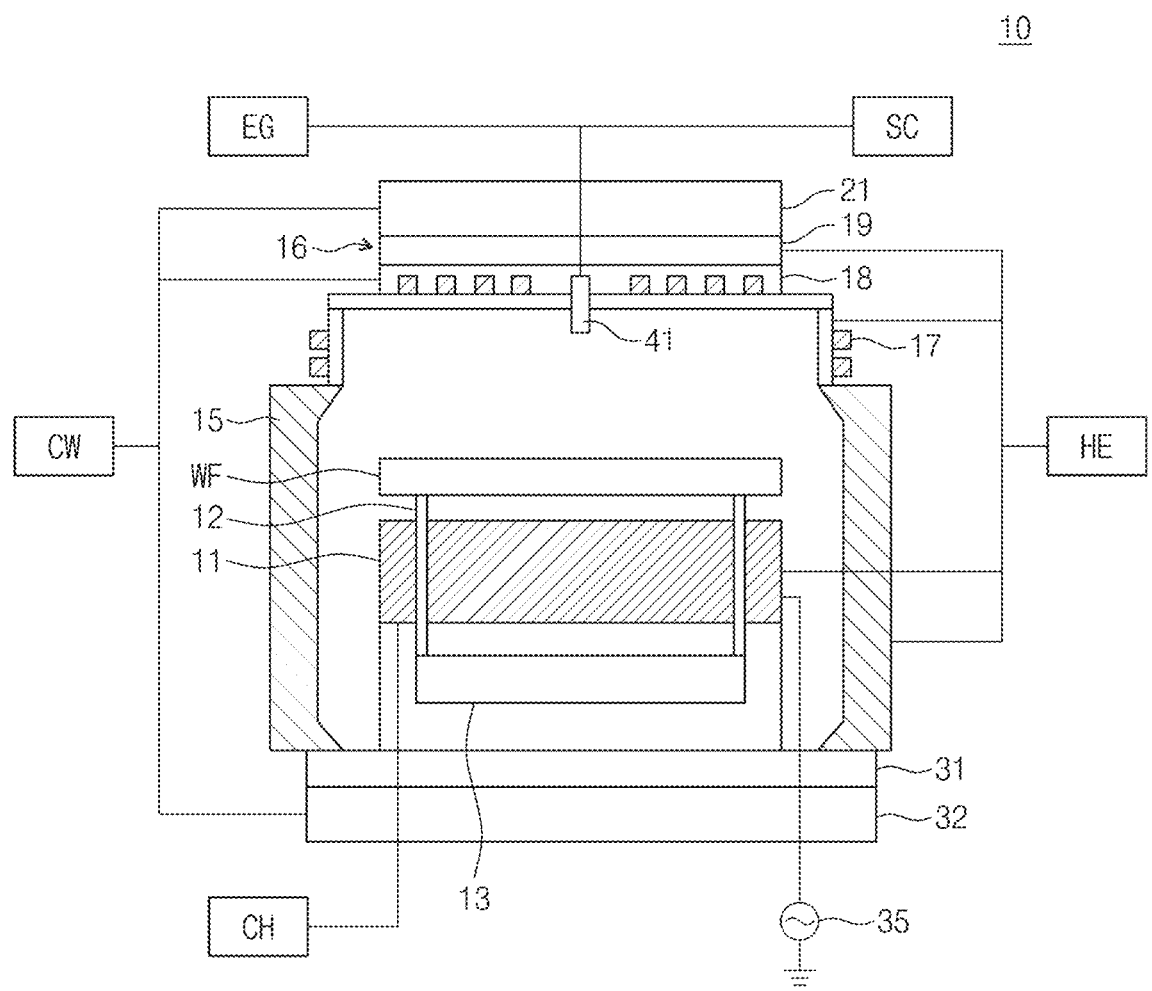
FIG. 14 is a conceptual diagram illustrating a deposition apparatus for forming second mask patterns, according to an example embodiment of the inventive concepts.
Figure 15:
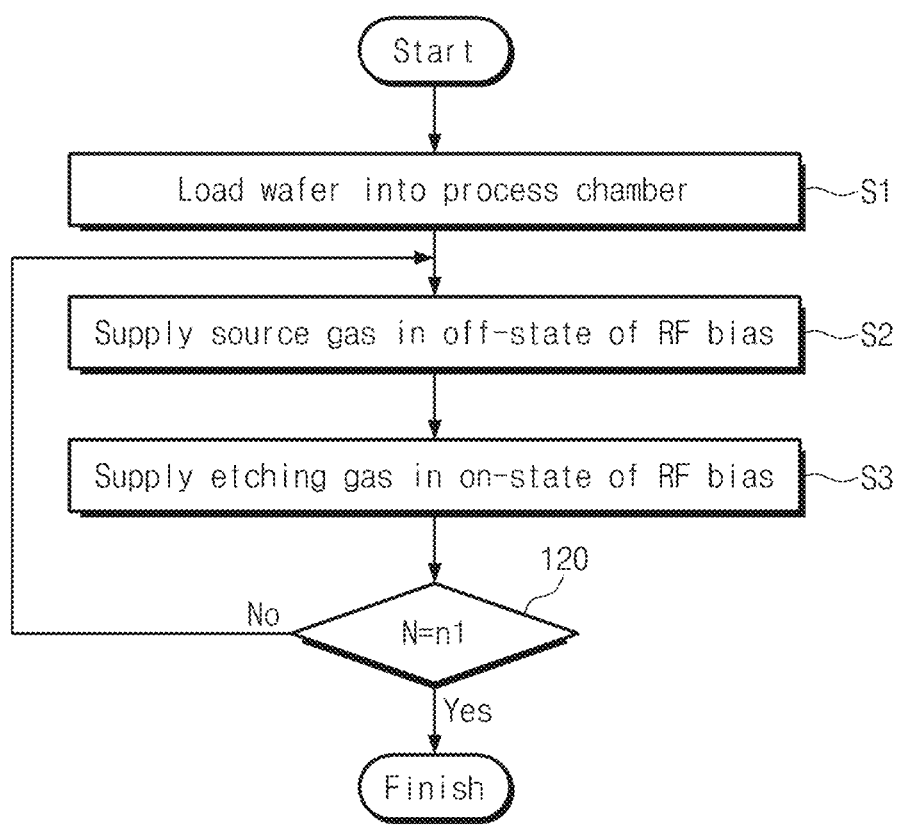
FIG. 15 is a flow chart illustrating a process of forming second mask patterns, according to an example embodiment of the inventive concepts.
Figure 16:
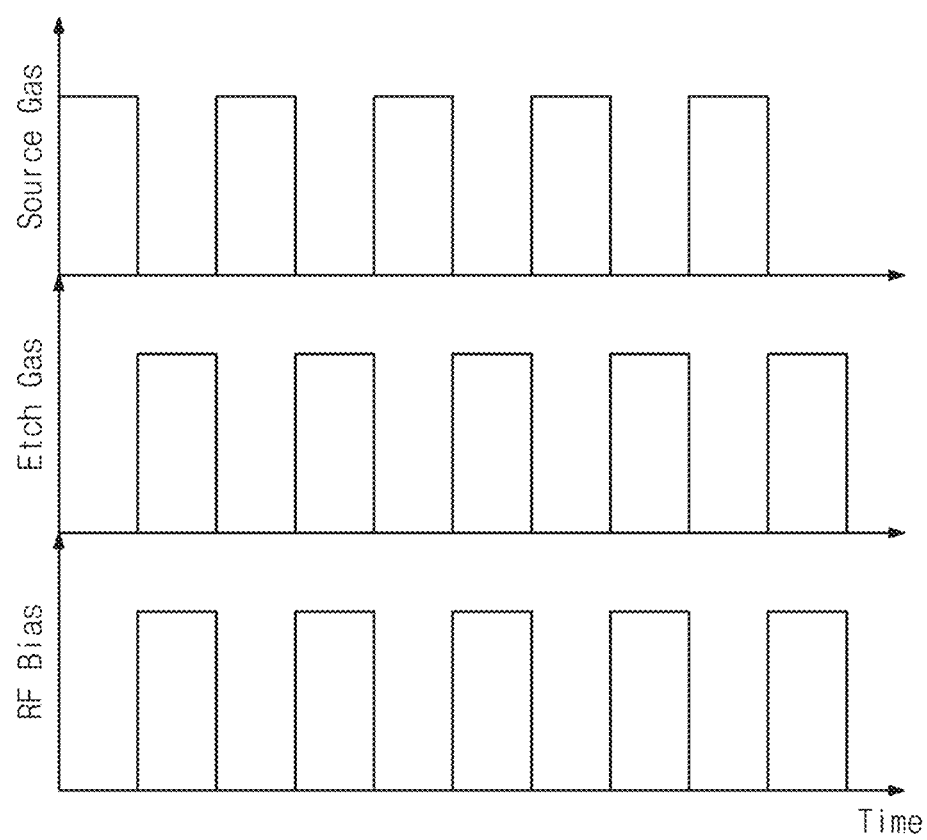
FIG. 16 is a timing diagram illustrating the supply of a source gas, the supply of an etching gas and a radio-frequency (RF) bias in a process of forming second mask patterns, according to an example embodiment of the inventive concepts.

FIG. 14 is a conceptual diagram illustrating a deposition apparatus for forming the second mask patterns H20 according to an example embodiment of the inventive concepts. FIG. 15 is a flow chart illustrating the process of forming the second mask patterns H20 according to an example embodiment of the inventive concepts. FIG. 16 is a timing diagram illustrating the supply of a source gas, the supply of an etching gas and a radio-frequency (RF) bias in the process of forming the second mask patterns H20 according to an example embodiment of the inventive concepts.

A deposition apparatus 10 of FIG. 14 may be, for example, an inductively coupled plasma apparatus. The deposition apparatus 10 may include a housing 15, an upper cover 16 provided on the housing 15 so as to be capable of being opened and closed, an upper coil 18 provided in the upper cover 16, and a heater structure 19 provided on the upper coil 18. In an example embodiment, the housing 15 and the upper cover 16 may constitute a process chamber. A remote plasma device 21 for cleaning the process chamber may be provided on the heater structure 19. A side coil 17 may be provided on a sidewall of the upper cover 16.

A susceptor 11 may be provided in the housing 15, and lift pins 12 may penetrate the susceptor 11 to support a wafer WF. A lift pin component 13 may be connected to the lift pins 12 and may be provided under the susceptor 11. The susceptor 11 may be connected to a temperature adjuster CH, and thus a temperature of the susceptor 11 may be adjusted by a heater or a refrigerant (e.g., helium). A turbo pump 32 and a valve unit 31 may be provided under the housing 15 to adjust an inner pressure of the housing 15. The turbo pump 32, the upper coil 18, and the remote plasma device 21 may be connected to a coolant adjuster CW so as to be cooled by a coolant. The heater structure 19, the susceptor 11, and the housing 15 may be connected to a heat exchanger HE.

The deposition apparatus 10 may include a nozzle 41 used to supply a gas into the process chamber. A first source SC supplying a source gas for deposition and a second source EG supplying an etching gas may be connected to the nozzle 41. The gases supplied into the process chamber through the nozzle 41 may be converted into plasma by an electric field generated by the upper coil 18 and the side coil 17. Frequencies of the upper coil 18 and the side coil 17 may be fixed or may be varied. For example, the frequency of the upper coil 18 may be one of 400 KHz, 2 MHz, and 13.45 MHz, and the frequency of the side coil 17 may be one of 400 KHz, 2 MHz, and 13.45 MHz. The susceptor 11 may be connected to a radio-frequency (RF) bias 35.

Referring to FIGS. 14 to 16, a wafer WF (e.g., the substrate 100) having the first mask patterns H11 may be loaded into the process chamber of the deposition apparatus 10 (S1). The process of forming the second mask patterns H20 may include alternately repeating, one or a plurality of times, supplying the source gas into the process chamber of the deposition apparatus 10 (S2) and supplying the etching gas into the process chamber (S3). In other word, the deposition step S2 and the etching step S3 may be repeatedly performed in-situ in the same process chamber. The source gas and the etching gas may be alternately and repeatedly supplied into the process chamber until the repetition number N of times (e.g., the cycle number) of the step S2 of supplying the source gas and the step S3 of supplying the etching gas reaches a desired, or alternatively predetermined number n1. In an example embodiment, the source gas may include silane and oxygen, and the etching gas may include $NF_3$. The etching gas may not be supplied during the deposition step S2 during which the source gas is supplied. The source gas may not be supplied during the etching step S3 during which the etching gas is supplied. Power of the RF bias 35 when the etching gas is supplied may be greater than the power of the RF bias 35 when the source gas is supplied. In an example embodiment, as illustrated in FIG. 16, the RF bias may be off when the source gas is supplied, and the RF bias may be on when the etching gas is supplied. In other word, during the process of forming the second mask patterns H20, the source gas and the etching gas may be alternately and repeatedly supplied, and the RF bias may be off during the supply of the source gas and may be on during the supply of the etching gas. That is, the RF bias may be provided in a pulse form in such a way as to meet alternate timing of the source gas and the etching gas. In an example embodiment, the power of the RF bias may range from about 700 W to about 1300 W when the etching gas is supplied. In one cycle, a supply time of the source gas may range from about 50 seconds to about 100 seconds, and a supply time of the etching gas may range from about 10 seconds to about 50 seconds. One or more purge steps using the turbo pump 32 and the valve unit 31 may be added between the deposition step S2 and the etching step S3. Alternatively, the one or more purge steps may be omitted. The inner temperature of the process chamber may be maintained in a range of about 300° C. to about 500° C. A flow rate of the source gas may range from about 50 ccm to about 100 ccm. A flow rate of the etching gas may range from about 50 ccm to about 100 ccm.

Figure 17:
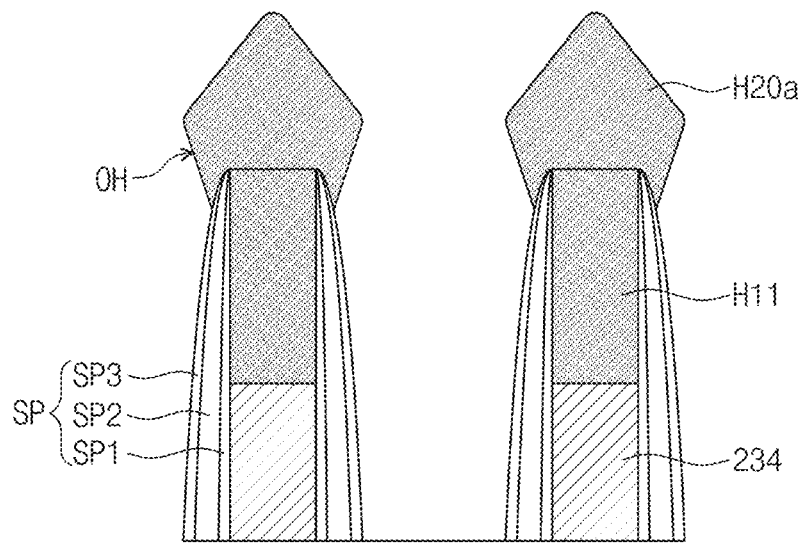
FIGS. 17 and 18 are cross-sectional views illustrating a process of forming second mask patterns, according to an example embodiment of the inventive concepts.
Figure 18:
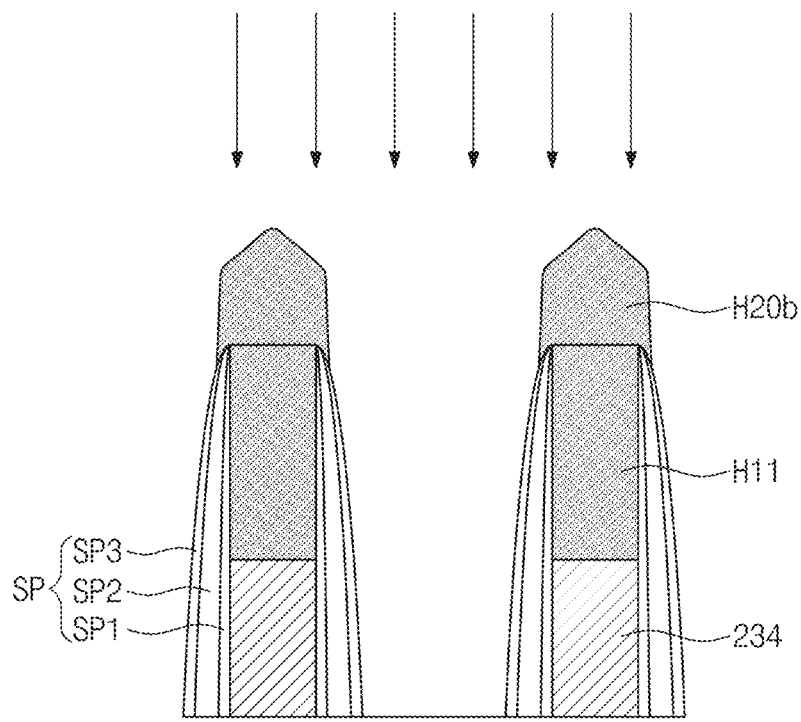

FIGS. 17 and 18 are cross-sectional views illustrating a process of forming the second mask patterns H20 according to an example embodiment of the inventive concepts. FIG. 17 illustrates a second mask pattern material having a first shape H20a which is formed on each or on one or more of the first mask patterns H11 when the source gas is supplied in the off-state of the RF bias. The second mask pattern material having the first shape H20a may be locally formed on the top surface of each or of one or more of the first mask patterns H11 and may not be formed on sidewalls of the first mask pattern H11 (i.e., sidewalls of the spacers SP). Even though the second mask pattern material having the first shape H20a is formed on the sidewalls of the spacers SP, the amount of the second mask pattern material formed on the sidewall of the spacer SP may be substantially less than the amount of the second mask pattern material formed on the top surface of the first mask pattern H11. This may be because the second mask pattern material is relatively easily deposited on the top surface of the first mask pattern H11 relatively close to a supply position (i.e., the nozzle 41 of FIG. 14) of the source gas since the source gas is supplied in the off-state of the RF bias. The first shape H20a may have a shape that is tapered and that protrudes upward from the top surface of the first mask pattern H11. For example, the first shape H20a may have a pentagonal cross section. A width of an intermediate portion of the first shape H20a may be greater than the widths of a lower portion and an upper portion of the first shape H20a. In other word, the first shape H20a may include an overhang OH that protrudes from a center toward a sidewall of the first shape H20a and extends onto the sidewall of the spacer SP.

The second mask pattern material having the first shape H20a may be at least partially etched when the etching gas is supplied in the on-state of the RF bias, thereby forming a second shape H20b. FIG. 18 illustrates the second shape H20b. Since the RF bias is in the on-state, radicals of the etching gas in the plasma state may be linearly moved toward the substrate 100 (e.g., the wafer WF). Thus, the overhang OH may be easily removed. In other word, the second shape H20b may not have the overhang OH or may have a small-sized overhang. As a result, since the deposition step S2 and the etching step S3 of FIG. 15 are alternately repeated, the second mask pattern material may be grown in a vertical direction but the growth in a lateral direction of the second mask pattern material may be limited.

Figure 19:
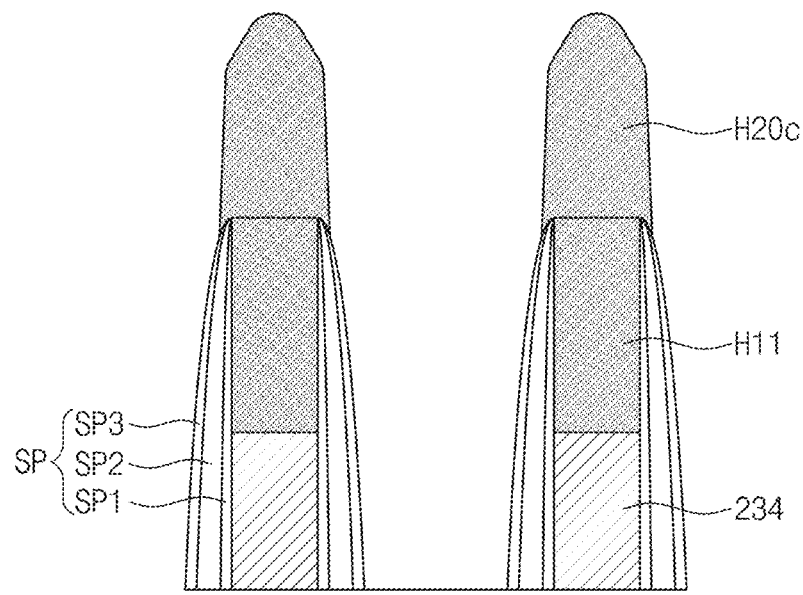
FIGS. 19 and 20 are cross-sectional views illustrating shapes of a second mask pattern in a state where a deposition process is finally finished.
Figure 20:
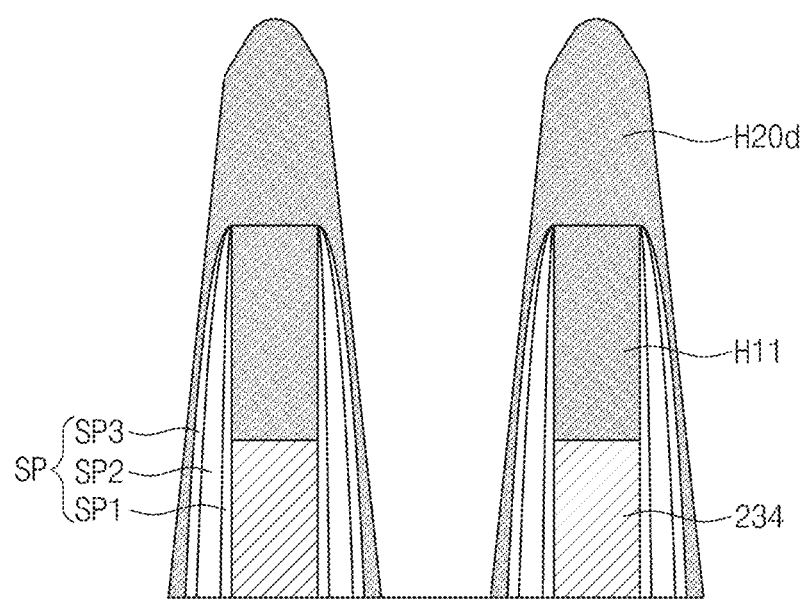

FIGS. 19 and 20 are cross-sectional views illustrating shapes of the second mask pattern in a state where a deposition process is completed. As illustrated in FIGS. 19 and 20, a shape of a final second mask pattern may have a shape that is tapered and that protrudes in a direction away from the substrate 100. The final second mask pattern may have a shape that is locally formed on the top surface of the first mask pattern H11, like a third shape H20c illustrated in FIG. 19. In addition, the final second mask pattern may have a shape further extending over the sidewalls of the spacers SP, like a fourth shape H20d illustrated in FIG. 20. This shape of the second mask pattern may be formed by modifying the step S2 of supplying the source gas and the step S3 of supplying the etching gas which are described with reference to FIGS. 15 and 16. For example, in the step S2 of supplying the source gas, the power of the RF bias may not be off and may be lower than the power of the RF bias used in the step S3 of supplying the etching gas. In this case, the second mask pattern material may remain on the sidewalls of the spacers SP.

Referring back to FIGS. 7A, 7B, 7C, and 7D, an insulating layer may be formed on the substrate 100, and a planarization process and/or a patterning process may be performed on the insulating layer to form first insulating patterns 250 spaced apart from each other in the second direction Y with trenches TR interposed therebetween. The first insulating patterns 250 may extend in the first direction X. For example, the planarization process may be an etch-back process or a CMP process. The first insulating patterns 250 may correspond to mold patterns used for forming second insulating patterns to be described below. The first insulating patterns 250 may include at least one of silicon oxide, silicon nitride, or silicon oxynitride. The first insulating patterns 250 may be formed using a CVD process.

Referring to FIGS. 8A, 8B, 8C, and 8D, preliminary second insulating patterns 255 may be formed to fill the trenches TR, respectively. The preliminary second insulating patterns 255 may extend in the first direction X and may be spaced apart from each other in the second direction Y when viewed from a plan view. The preliminary second insulating patterns 255 may cover the top surfaces of the second mask pattern H20 at first areas where the preliminary second insulating patterns 255 intersect the bit lines BL. The preliminary second insulating patterns 255 may cover the top surface of the buffer layer 210 at second areas where the preliminary second insulating patterns 255 do not intersect the bit lines BL. An insulating material may be deposited on the substrate 100, and a planarization process may be performed on the insulating material to form the preliminary second insulating patterns 255. The preliminary second insulating patterns 255 may be formed of or include an insulating material having an etch selectivity with respect to the first insulating patterns 250. For example, the first insulating patterns 250 may include silicon oxide, and the preliminary second insulating patterns 255 may include silicon nitride or silicon oxynitride.

Referring to FIGS. 9A, 9B, 9C, and 9D, the first insulating patterns 250 may be selectively removed to form second contact holes CH2. In an example embodiment, the selective removal of the first insulating patterns 25 may be performed using, for example, a wet etching process. The second contact holes CH2 may be defined by the preliminary second insulating patterns 255 extending in the first direction X, the bit lines BL extending in the second direction Y, and the first and second mask patterns H11 and H20 extending in the second direction Y. The second contact holes CH2 may expose the top surface of the buffer layer 210.

Referring to FIGS. 10A, 10B, 10C, and 10D, the buffer layer 210 exposed by the second contact holes CH2 and the device isolation layer 111 disposed thereunder may be etched to expose the source/drain regions SD. In other word, the second contact holes CH2 may extend to expose the active regions AR. The etching process of the buffer layer 210 and the device isolation layer 111 may be performed using the preliminary second insulating patterns 255 and the second mask patterns H20 as etch masks. At this time, upper portions of the second mask patterns H20 may be etched, so the second mask patterns H20 may be formed into second mask patterns H21. In addition, each or one or more of the preliminary second insulating patterns 255 may be divided into second insulating patterns 256 that are spaced apart from each other with the second mask patterns H21 and are confined between the bit lines BL in a plan view.

A thickness h4 of the second mask patterns H21 may range from about 30% to about 70% of the thickness h3 of the second mask patterns H20 described with reference to FIGS. 6A to 6D. The second contact holes CH2 may expose the source/drain regions SD formed in both end portions of each active region AR. Exposing the source/drain regions SD may be performed using, for example, a dry etching process.

Referring to FIGS. 11A, 11B, 11C, and 11D, storage node contacts BC may be formed in the second contact holes CH2, respectively. The upper surfaces of the storage node contacts BC may be formed to be lower than the top surfaces of the first mask patterns H11. In other word, each or one or more of the storage node contacts BC may at least partially fill each or one or more of the second contact holes CH2. A conductive layer may be formed to substantially completely fill the second contact holes CH2, and an etch-back process may be performed on the conductive layer to form the storage node contacts BC. At least a portion of the second mask patterns H21 of FIGS. 10A to 10D may be removed during the etch-back process.

After the etch-back process, upper portions of the spacers SP exposed by the storage node contacts BC may be removed to expose the sidewalls of the first mask patterns H11 through the second contact holes CH2. Alternatively, the first spacers SP1 exposed by the second contact holes CH2 may be removed, and then, an additional spacer to be described below may be formed to form air gaps on the sidewalls of the bit lines BL. For the purpose of ease and convenience in explanation, the second mask patterns H21 may be substantially completely removed in FIGS. 11A to 11D. Alternatively, portions of the second mask patterns H21 may remain on the first mask patterns H11, or upper portions of the first mask patterns H11 may be removed together with the second mask patterns H21. Hereinafter, shapes of the mask patterns after the etch-back process will be described in more detail with reference to FIGS. 21 and 22.

Figure 21:
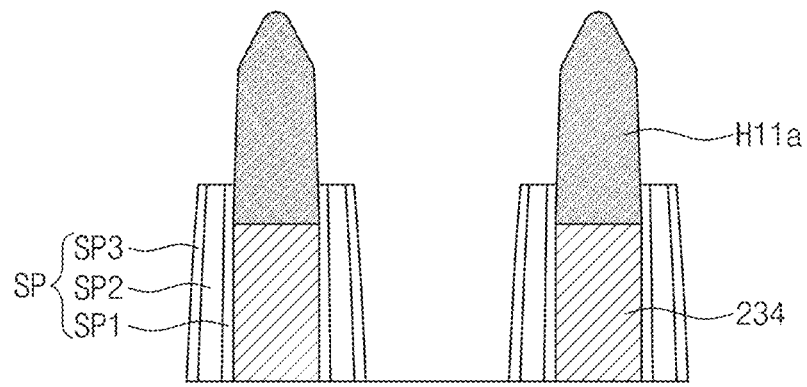
FIGS. 21 and 22 are cross-sectional views illustrating shapes of mask patterns after an etch-back process.
Figure 22:
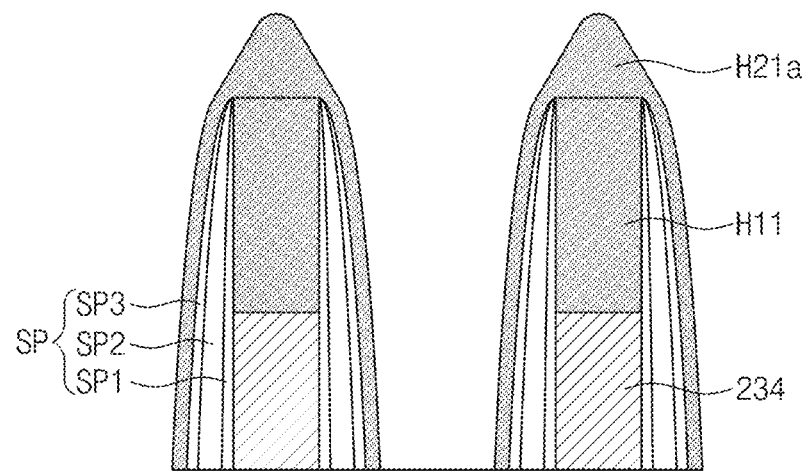

FIGS. 21 and 22 are cross-sectional views illustrating shapes of mask patterns after the etch-back process. In an example embodiment of FIG. 21, by the etch-back process, the second mask patterns H21 may be substantially completely removed and upper portions of the first mask patterns H11 may be at least partially removed. As described above, since the second mask patterns H2 have the tapered shapes protruding in the direction away from the substrate 100, the shapes of the second mask patterns H2 may be transferred to upper portions of the first mask patterns H11a remaining on the bit lines BL. In other word, the upper portions of the first mask patterns H11a according to an example embodiment may have tapered shapes protruding in the direction away from the substrate 100. FIG. 22 illustrates portions H21a of the second mask patterns which remain on the first mask patterns H11 after the etch-back process. The shapes according to the example embodiment may be realized in a case that initial first mask patterns are formed to have relatively small thicknesses and the second mask patterns are formed to have relatively large thicknesses. The remaining portions H21a of the second mask patterns may extend onto the sidewalls of the spacers SP. Alternatively, the remaining portions H21a of the second mask patterns may not remain on the sidewalls of the spacers SP.

Referring to FIGS. 12A, 12B, 12C, and 12D, additional spacers 261 may be formed on the exposed sidewalls of the first mask patterns H11. The additional spacers 261 may have wider widths than the spacers SP. The additional spacers 261 may include at least one of silicon oxide, silicon nitride, or silicon oxynitride. A conductive layer may be formed on the resultant structure having the additional spacers 261, and a patterning process may be performed on the conductive layer to form landing pads LP. The landing pads LP may be connected to the storage node contacts BC to electrically connect the storage node contacts BC to lower electrodes to be described below, respectively. The landing pads LP may include at least one of a metal, a conductive metal nitride, or a doped semiconductor material. Each or one or more of the landing pads LP may include a portion laterally extending onto the bit line BL and another portion vertically extending from the storage node contact BC. However, example embodiments of the inventive concepts are not limited thereto. The shapes of the landing pads LP may be variously modified. An interlayer insulating layer 260 may be formed to fill a space between the landing pads LP. An insulating layer may be formed on the landing pads LP and a planarization process may be performed on the insulating layer until the landing pads LP are exposed, thereby forming the interlayer insulating layer 260. The interlayer insulating layer 260 may include a silicon oxide layer.

Referring to FIGS. 13A, 13B, 13C, and 13D, lower electrodes 280, a dielectric layer 281, and an upper electrode 282 may be formed, for example sequentially formed, on the landing pads LP and the interlayer insulating layer 260. The lower electrodes 280, the dielectric layer 281, and the upper electrode 282 may constitute capacitors of a semiconductor device. Each or one or more of the lower electrodes 280 may be formed to have a hollow cylindrical shape a bottom end of which is closed. Forming the lower electrodes 280 may include forming a sacrificial layer (not shown) exposing the landing pads LP, conformally forming a conductive layer on the sacrificial layer, and forming a filling layer on the conductive layer. Thereafter, by an etching process, the conductive layer may be divided into the lower electrodes 280 which are respectively formed on the landing pads LP and are separated from each other. Subsequently, the sacrificial layer and the filling layer may be removed. A support layer for reducing or substantially preventing the lower electrodes 280 from leaning because of a high aspect ratio may be formed in the process of forming the lower electrodes 280.

The lower electrodes 280 and the upper electrode 282 may include at least one of a semiconductor material doped with dopants (e.g., doped poly-crystalline silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide). The dielectric layer 281 may be formed of or include a single-layer or multi-layer including at least one of a metal oxide (e.g., $HfO_2$, $ZrO_2$, $Al_2O_3$, $La_2O_3$, $Ta_2O_3$, or $TiO_2$) and a perovskite-structural dielectric material (e.g., $SrTiO_3$ (STO), $(Ba,Sr)TiO_3$ (BST), $BaTiO_3$, PZT, or PLZT). In an example embodiment, the dielectric layer 281 may have a thickness of about 5 nm to about 15 nm.

According to an example embodiment of the inventive concepts, it is possible to reduce the thickness h1 of the first mask patterns H10 initially formed in FIGS. 4A to 4D. First mask patterns may be used as the etch masks during the process of opening the source/drain regions described with reference to FIGS. 10A to 10D as well as the etch masks for forming the bit lines BL, and may be removed by the etch-back process used to form the storage node contacts described with reference to FIGS. 11A to 11D, and thus, the first mask patterns should be formed in the process of FIGS. 4A to 4D. As a result, the first mask patterns initially formed may have a large aspect ratio. In addition, the aspect ratio of the first mask pattern may increase as an integration density of a semiconductor device increases. For example, the aspect ratio of the first mask patterns may be greater than zero and range from about 15 to about 25. When the first mask patterns have such a large aspect ratio, a leaning problem of the first mask patterns may be caused.

According to an example embodiment of the inventive concepts, the second mask patterns may be additionally formed after the patterning process of forming the bit lines. More particularly, the second mask patterns may be formed after the patterning process of forming the bit lines and before the formation of the second insulating patterns. As a result, the thicknesses of the first mask patterns initially formed to form the bit lines may be reduced due to the second mask patterns. Thus, the thicknesses of initially formed mask patterns may be reduced to reduce or substantially prevent the leaning problem. In addition, since the second mask patterns are locally formed on the first mask patterns without an additional photolithography process, the fabricating processes of the semiconductor device may be simplified and the leaning problem may be reduced or substantially prevented.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate;
word lines buried in the substrate;
bit line structures disposed on the substrate, each bit line structure, of the bit line structures, including a bit line and a mask pattern on the bit line, the mask pattern having a lower mask pattern and an upper mask pattern on the lower mask pattern;
storage node contacts between the bit line structures;
a spacer on a sidewall of the bit line structures;
landing pads on the storage node contacts; and
a capacitor on the landing pad, the capacitor including lower electrodes, upper electrode, and dielectric layer between the lower electrodes and the upper electrode,
wherein
a first width of the lower mask pattern in a first direction is greater than a second width of an upper portion of the upper mask pattern in the first direction, the first direction being parallel to a surface of the substrate, and
the upper mask pattern is thicker than the lower mask pattern in a second direction, the second direction being perpendicular to the surface of the substrate, and
the lower mask pattern has a first line shape and the upper mask pattern has a second line shape that is aligned with the lower mask pattern,
levels of bottom surfaces of the bit lines are at a same height,
levels of top surfaces of the bit lines are at a same height,
top surfaces of the landing pads are flat,
bottom surfaces of the dielectric layer between the lower electrodes are flat,
a thickness of the mask pattern in the second direction is greater than a thickness of the bit line in the second direction, and
the upper mask pattern is above the lower mask pattern.

2. The semiconductor device of claim 1, wherein a third width of a sum of a lower portion of the mask pattern and the spacer in the first direction is greater than a fourth width of a sum of an upper portion of the bit line and the spacer in the first direction.

3. The semiconductor device of claim 1, wherein a width of one of the landing pads on the spacer in the first direction is greater than a width of the mask pattern in the first direction.

4. The semiconductor device of claim 1, wherein bottom surfaces of landing pads are higher than a top surface of the bit line.

5. The semiconductor device of claim 4, wherein bottom surfaces of the landing pads are lower than a bottom surface of the upper mask pattern.

6. The semiconductor device of claim 1, wherein the lower mask pattern includes a same material as the upper mask pattern.

7. The semiconductor device of claim 1, wherein a sidewall of the upper mask pattern is exposed by the spacer.

8. The semiconductor device of claim 1, further comprising a interlayer insulating layer on a sidewall of the landing pad and disposed on the upper mask pattern,
wherein the interlayer insulating layer is in contact with the upper mask pattern.

9. The semiconductor device of claim 1, wherein the first line shape is the same as the second line shape in a plan view.

10. The semiconductor device of claim 1, wherein the lower mask pattern is in contact with the upper mask pattern.

11. A semiconductor device comprising:
a substrate;
word lines buried in the substrate;
bit line structures disposed on the substrate, each bit line structure, of the bit lines structures, including a bit line and a mask pattern on the bit line, the mask pattern having a lower mask pattern and an upper mask pattern on the lower mask pattern;
storage node contacts between the bit line structures;
a spacer on a sidewall of the bit line structures;
landing pads on the storage node contacts; and
a capacitor on the landing pad, the capacitor including lower electrodes, upper electrode, and dielectric layer between the lower electrodes and the upper electrode, wherein
a first width of the lower mask pattern in a first direction is greater than a second width of an upper portion of the upper mask pattern in the first direction, the first direction being parallel to a surface of the substrate,
the upper mask pattern is thicker than the lower mask pattern in a second direction, the second direction being perpendicular to the surface of the substrate,
the lower mask pattern has a first line shape and the upper mask pattern has a second line shape that is aligned with the lower mask pattern,
levels of bottom surfaces of the bit lines are at a same height,
levels of top surfaces of the bit lines are at a same height,
a thickness of the mask pattern in the second direction is greater than a thickness of the bit line in the second direction, and
the upper mask pattern is above the lower mask pattern.

12. The semiconductor device of claim 11, wherein a third width of a sum of a lower portion of the mask pattern and the spacer in the first direction is greater than a fourth width of a sum of an upper portion of the bit line and the spacer in the first direction.

13. The semiconductor device of claim 11, wherein a width of one of the landing pads on the spacer in the first direction is greater than a width of the mask pattern in the first direction.

14. The semiconductor device of claim 11, wherein bottom surfaces of the landing pads are higher than a top surface of the bit line.

15. The semiconductor device of claim 14, wherein bottom surfaces of the landing pads are lower than a bottom surface of the upper mask pattern.

16. The semiconductor device of claim 11, wherein the lower mask pattern includes a same material as the upper mask pattern.

17. The semiconductor device of claim 11, wherein a sidewall of the upper mask pattern is exposed by the spacer.

18. The semiconductor device of claim 11, further comprising a interlayer insulating layer on a sidewall of the landing pad and disposed on the upper mask pattern,
wherein the interlayer insulating layer is in contact with the upper mask pattern.

19. The semiconductor device of claim 11, wherein the first line shape is the same as the second line shape in a plan view.

20. The semiconductor device of claim 11, wherein the lower mask pattern is in contact with the upper mask pattern.

* * * * *